(12) United States Patent
Kim et al.

(10) Patent No.: US 12,167,672 B2
(45) Date of Patent: Dec. 10, 2024

(54) ORGANIC LIGHT-EMITTING DEVICE

(71) Applicant: LG CHEM, LTD, Seoul (KR)

(72) Inventors: Hoon Jun Kim, Daejeon (KR); Ji Young Choi, Daejeon (KR); Sang Duk Suh, Daejeon (KR); Woochul Lee, Daejeon (KR); Joo Ho Kim, Daejeon (KR); Dong Hoon Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 704 days.

(21) Appl. No.: 17/414,923

(22) PCT Filed: Jan. 16, 2020

(86) PCT No.: PCT/KR2020/000802
§ 371 (c)(1),
(2) Date: Jun. 16, 2021

(87) PCT Pub. No.: WO2020/149666
PCT Pub. Date: Jul. 23, 2020

(65) Prior Publication Data
US 2022/0069223 A1    Mar. 3, 2022

(30) Foreign Application Priority Data
Jan. 18, 2019   (KR) ........................ 10-2019-0006795

(51) Int. Cl.
*H10K 85/30* (2023.01)
*H10K 85/60* (2023.01)
*H10K 50/11* (2023.01)
*H10K 50/12* (2023.01)
*H10K 101/30* (2023.01)
*H10K 101/40* (2023.01)

(52) U.S. Cl.
CPC ......... *H10K 85/322* (2023.02); *H10K 85/626* (2023.02); *H10K 85/636* (2023.02); *H10K 85/6572* (2023.02); *H10K 50/11* (2023.02); *H10K 50/12* (2023.02); *H10K 2101/30* (2023.02); *H10K 2101/40* (2023.02)

(58) Field of Classification Search
None
See application file for complete search history.

(56) References Cited

U.S. PATENT DOCUMENTS

| | | |
|---|---|---|
| 2004/0251816 A1 | 12/2004 | Leo et al. |
| 2018/0006244 A1 | 1/2018 | Cha et al. |
| 2018/0094000 A1 | 4/2018 | Hatakeyama et al. |
| 2018/0301629 A1 | 10/2018 | Hatakeyama et al. |
| 2020/0052212 A1 | 2/2020 | Tasaki et al. |
| 2021/0053998 A1* | 2/2021 | Kim ................. H10K 85/6572 |
| 2021/0083193 A1* | 3/2021 | Tasaki .................... C09K 11/06 |
| 2021/0336154 A1* | 10/2021 | Nakano ............... H10K 85/6572 |
| 2021/0384430 A1* | 12/2021 | Nakano ............... H10K 85/623 |
| 2022/0006019 A1* | 1/2022 | Kim .................. H10K 85/6576 |
| 2022/0285625 A1* | 9/2022 | Tasaki .................... H05B 33/12 |
| 2023/0042023 A1* | 2/2023 | Tasaki .................. H10K 85/633 |

FOREIGN PATENT DOCUMENTS

| | | |
|---|---|---|
| CN | 105655496 | 6/2016 |
| CN | 107915648 | 4/2018 |
| CN | 108929261 | 12/2018 |
| KR | 10-2010-0069216 A | 6/2010 |
| KR | 10-2016-087331 A | 7/2016 |
| KR | 10-2016-0090242 A | 7/2016 |
| KR | 10-2017-0130434 A | 11/2017 |
| KR | 10-2017-0130435 A | 11/2017 |
| KR | 10-2020-0019272 A | 2/2020 |
| WO | 2003/012890 A2 | 2/2003 |
| WO | 2016-152418 A1 | 9/2016 |
| WO | 2016-152544 A1 | 9/2016 |
| WO | 2018-186404 A1 | 10/2018 |

* cited by examiner

*Primary Examiner* — Robert S Loewe
(74) *Attorney, Agent, or Firm* — Bryan Cave Leighton Paisner LLP

(57) ABSTRACT

An organic light emitting device including a first electrode; a second electrode provided opposite to the first electrode; and one or more organic material layers provided between the first electrode and the second electrode, wherein one or more of the one or more organic material layers include a compound of Chemical Formula 1 and a compound of Chemical Formula 2.

7 Claims, 1 Drawing Sheet

[FIG. 1]
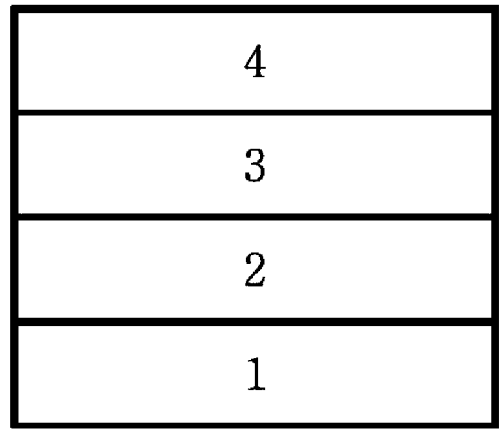
[FIG. 2]
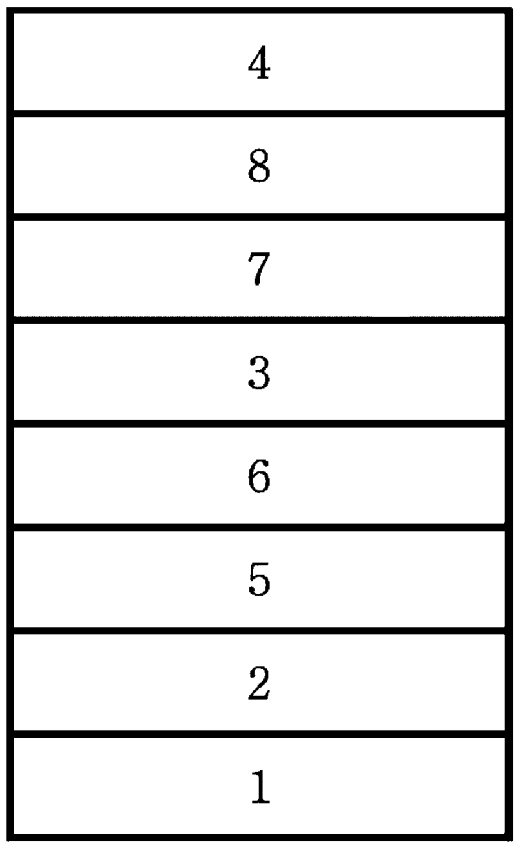

ORGANIC LIGHT-EMITTING DEVICE

CROSS-REFERENCE TO RELATED APPLICATIONS

This application is a U.S. national stage of international application No. PCT/KR2020/000802 filed Jan. 16, 2020, which claims priority to and the benefits of Korean Patent Application No. 10-2019-0006795, filed with the Korean Intellectual Property Office on Jan. 18, 2019, the entire contents of which are incorporated herein by reference.

TECHNICAL FIELD

The present application relates to an organic light emitting device including a compound of Chemical Formula 1 and a compound of Chemical Formula 2.

BACKGROUND

An organic light emission phenomenon generally refers to the conversion of electrical energy to light energy using an organic material. An organic light emitting device using an organic light emission phenomenon normally has a structure including an anode, a cathode, and an organic material layer therebetween. Herein, the organic material layer is often formed in a multilayer structure having different materials in order to increase efficiency and stability of the organic light emitting device, and for example, may be formed with a hole injection layer, a hole transfer layer, a light emitting layer, an electron transfer layer, an electron injection layer and the like. When a voltage is applied between the two electrodes in such an organic light emitting device structure, holes and electrons are injected into the organic material layer from the anode and the cathode, respectively, and when the injected holes and electrons meet, excitons are formed, and light is emitted when these excitons fall back to the ground state.

Development of new materials for such an organic light emitting device has been continuously required.

SUMMARY

The present application is directed to providing an organic light emitting device.

One exemplary embodiment of the present application provides an organic light emitting device including a first electrode; a second electrode provided opposite to the first electrode; and one or more organic material layers provided between the first electrode and the second electrode, wherein one or more layers of the organic material layers include a compound of Chemical Formula 1 and a compound of Chemical Formula 2:

[Chemical Formula 1]

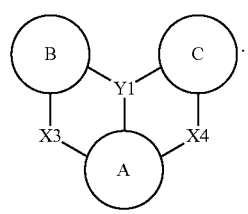

In Chemical Formula 1,

A, B and C are each independently a substituted or unsubstituted aromatic hydrocarbon ring; or a substituted or unsubstituted heteroring, X3 and X4 are each independently O; S; or NR, Y1 is boron or phosphine oxide, R is hydrogen; deuterium; a halogen group; a cyano group; a substituted or unsubstituted alkyl group; a substituted or unsubstituted silyl group; a substituted or unsubstituted alkoxy group; a substituted or unsubstituted aryl group; or a substituted or unsubstituted heterocyclic group, and adjacent groups among R, A, B and C bond to each other to form a ring,

[Chemical Formula 2]

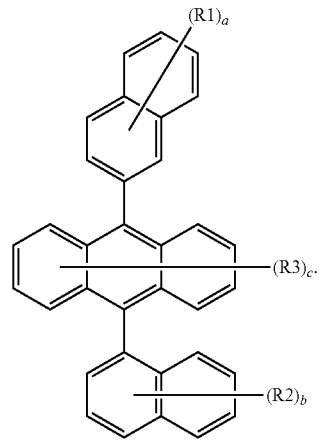

In Chemical Formula 2,

R1 to R3 are each independently hydrogen; deuterium; a halogen group; a cyano group; a substituted or unsubstituted alkyl group; a substituted or unsubstituted silyl group; a substituted or unsubstituted alkoxy group; a substituted or unsubstituted aryl group; or a substituted or unsubstituted heterocyclic group, a and b are each independently an integer of 0 to 7, c is an integer of 4 to 8, with the proviso that when a and b are each an integer of 2 or greater, the plurality of R1s and R2s are each the same as or different from each other, and R3s are the same as or different from each other, and four or more R3s are deuterium.

An organic light emitting device using two types of compounds according to an exemplary embodiment of the present application is capable of achieving low driving voltage, high light emission efficiency and/or long lifetime.

BRIEF DESCRIPTION OF DRAWINGS

FIG. 1 is an illustration of an organic light emitting device in which a substrate (1), an anode (2), a light emitting layer (3) and a cathode (4) are consecutively laminated.

FIG. 2 is an illustration of an organic light emitting device in which a substrate (1), an anode (2), a hole injection layer (5), a hole transfer layer (6), a light emitting layer (3), an electron transfer layer (7), an electron injection layer (8) and a cathode (4) are consecutively laminated.

REFERENCE NUMERALS USED HEREIN

1: Substrate
2: Anode
3: Light Emitting Layer

4: Cathode
5: Hole Injection Layer
6: Hole Transfer Layer
7: Electron Transfer Layer
8: Electron Injection Layer

DETAILED DESCRIPTION

Hereinafter, the present specification will be described in more detail.

One exemplary embodiment of the present specification provides an organic light emitting device including a compound of Chemical Formula 1 and a compound of Chemical Formula 2.

Examples of substituents in the present specification are described below, however, the substituents are not limited thereto.

The term "substitution" means a hydrogen atom bonded to a carbon atom of a compound being replaced by another substituent. The position of substitution is not limited as long as it is a position at which the hydrogen atom is substituted, and when there are two or more substituents, the two or more substituents may be the same as or different from each other.

In the present specification, the term "substituted or unsubstituted" means being substituted with one, two or more substituents selected from the group consisting of deuterium; a halogen group; a nitrile group; a nitro group; a hydroxyl group; a substituted or unsubstituted alkyl group; a substituted or unsubstituted cycloalkyl group; a substituted or unsubstituted alkenyl group; a substituted or unsubstituted amine group; a substituted or unsubstituted aryl group; and a substituted or unsubstituted heterocyclic group, or being substituted with a substituent linking two or more substituents among the substituents illustrated above, or having no substituents. For example, "a substituent linking two or more substituents" may be a biphenyl group. In other words, a biphenyl group may be considered to be an aryl group or a substituent linking two phenyl groups.

In the present specification, examples of the halogen group may include fluorine, chlorine, bromine or iodine.

In the present specification, the alkyl group may be linear or branched, and although not particularly limited thereto, the number of carbon atoms is preferably from 1 to 50. Specific examples thereof may include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl and the like, but are not limited thereto.

In the present specification, the cycloalkyl group is not particularly limited, but preferably has 3 to 60 carbon atoms. Specific examples thereof may include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl and the like, but are not limited thereto.

In the present specification, the alkoxy group may be linear, branched or cyclic. The number of carbon atoms of the alkoxy group is not particularly limited, but is preferably from 1 to 20. Specific examples thereof may include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy and the like, but are not limited thereto.

In the present specification, the alkenyl group may be linear or branched, and although not particularly limited thereto, the number of carbon atoms is preferably from 2 to 40. Specific examples thereof may include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group and the like, but are not limited thereto.

In the present specification, the amine group may be selected from the group consisting of —NH$_2$; an alkylamine group; an N-alkylarylamine group; an arylamine group; an N-arylheteroarylamine group; an N-alkylheteroarylamine group and a heteroarylamine group, and although not particularly limited thereto, the number of carbon atoms is preferably from 1 to 30. Specific examples of the amine group may include a methylamine group; a dimethylamine group; an ethylamine group; a diethylamine group; a phenylamine group; a naphthylamine group; a biphenylamine group; an anthracenylamine group; a 9-methylanthracenylamine group; a diphenylamine group; an N-phenylnaphthylamine group; a ditolylamine group; an N-phenyltolylamine group; a triphenylamine group; an N-phenylbiphenylamine group; an N-biphenylnaphthylamine group; an N-naphthylfluorenylamine group; an N-phenylphenanthrenylamine group; an N-biphenylphenanthrenylamine group; an N-phenylfluorenylamine group; an N-phenylterphenylamine group; an N-phenanthrenylfluorenylamine group; an N-biphenylfluorenylamine group and the like, but are not limited thereto.

In the present specification, the silyl group may be represented by —SiRaRbRc, where Ra, Rb and Rc are the same as or different from each other, and may be each independently hydrogen; a substituted or unsubstituted alkyl group; or a substituted or unsubstituted aryl group. Specific examples of the silyl group may include a trimethylsilyl group; a triethylsilyl group; a t-butyldimethylsilyl group; a vinyldimethylsilyl group; a propyldimethylsilyl group; a triphenylsilyl group; a diphenylsilyl group; a phenylsilyl group and the like, but are not limited thereto.

In the present specification, the aryl group is not particularly limited, but preferably has 6 to 60 carbon atoms, and may be a monocyclic aryl group or a polycyclic aryl group. When the aryl group is a monocyclic aryl group, the number of carbon atoms is not particularly limited, but is preferably from 6 to 25. Specific examples of the monocyclic aryl group may include a phenyl group, a biphenyl group, a terphenyl group and the like, but are not limited thereto.

When the aryl group is a polycyclic aryl group, the number of carbon atoms is not particularly limited, but is preferably from 10 to 24. Specific examples of the polycyclic aryl group may include a naphthyl group, an anthracenyl group, a phenanthryl group, a pyrenyl group, a perylenyl group, a chrysenyl group, a fluorenyl group and the like, but are not limited thereto.

In the present specification, the fluorenyl group may be substituted, and adjacent groups may bond to each other to form a ring.

Examples of a substituted fluorenyl group may include:

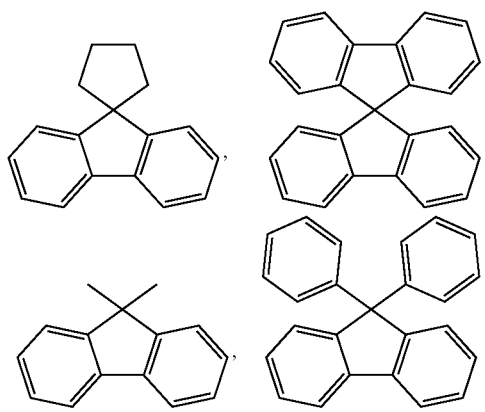

and the like. However, the structure is not limited thereto.

In the present specification, the heterocyclic group is a group including heteroatoms, that is, one or more atoms that are not carbon, and specifically, the heteroatom may include one or more atoms selected from the group consisting of O, N, Se, S and the like. The number of carbon atoms of the heterocyclic group is not particularly limited, but is preferably from 2 to 60. Examples of the heterocyclic group may include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group and the like, but are not limited thereto.

In the present specification, the description of an aryl group provided above may be applied to any aromatic hydrocarbon ring except for those that are divalent.

In the present specification, the definition of a heterocyclic group provided above may be applied to any heteroring except for those that are divalent.

In the present specification, bonding to adjacent groups to form a ring means bonding to adjacent groups to form a substituted or unsubstituted hydrocarbon ring; or a substituted or unsubstituted heteroring. The hydrocarbon ring and the heteroring may each be aliphatic, aromatic or a fused type thereof, but are not limited thereto.

In the present specification, the aliphatic hydrocarbon ring means a ring that is not aromatic, and is formed only with carbon and hydrogen atoms.

In the present specification, examples of the aromatic hydrocarbon ring may include a phenyl group, a naphthyl group, an anthracenyl group and the like, but are not limited thereto.

In the present specification, the aliphatic heteroring means an aliphatic ring including one or more heteroatoms.

In the present specification, the aromatic heteroring means an aromatic ring including one or more heteroatoms.

In the present specification, the aliphatic hydrocarbon ring, the aromatic hydrocarbon ring, the aliphatic heteroring and the aromatic heteroring may each be monocyclic or polycyclic.

In the present specification, adjacent groups may bond to form the following ring structures:

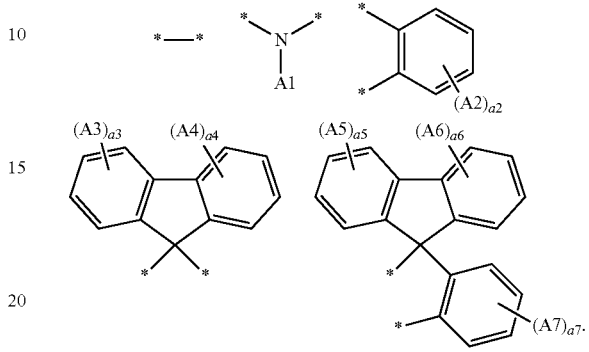

In these structures,

A1 to A7 are each independently hydrogen; deuterium; a halogen group; a substituted or unsubstituted silyl group; a substituted or unsubstituted alkyl group; a substituted or unsubstituted cycloalkyl group; a substituted or unsubstituted aryl group; or a substituted or unsubstituted heterocyclic group, a2 to a7 are each an integer of 0 to 4, with the proviso that when a2 to a7 are each independently 2 or greater, substituents in parentheses are the same as or different from each other, and indicates a position that is substituted.

In the present specification, an "adjacent" group may mean a substituent directly linked to an atom substituted by the corresponding substituent, a substituent sterically most closely positioned to the corresponding substituent, or another substituent of an atom substituted by the corresponding substituent. For example, two substituents substituting ortho positions in a benzene ring, and two substituents substituting the same carbon in an aliphatic ring may be interpreted as groups "adjacent" to each other.

According to one exemplary embodiment of the present application, A, B and C are each independently a substituted or unsubstituted aromatic hydrocarbon ring; or a substituted or unsubstituted heteroring.

According to another exemplary embodiment of the present application, A, B and C are each independently a substituted or unsubstituted aromatic hydrocarbon ring having 6 to 60 carbon atoms; or a substituted or unsubstituted heteroring having 3 to 60 carbon atoms.

According to another exemplary embodiment of the present application, A, B and C are each independently a substituted or unsubstituted aromatic hydrocarbon ring having 6 to 30 carbon atoms; or a substituted or unsubstituted heteroring having 3 to 30 carbon atoms.

According to one exemplary embodiment of the present application, A, B and C are each independently a substituted or unsubstituted benzene; a substituted or unsubstituted naphthalene; or a dibenzofuran.

According to one exemplary embodiment of the present application, A is a benzene, which may be unsubstituted or substituted with one or more substituents selected from the group consisting of an amine group, a carbazole group and an alkyl group; a naphthalene; or a dibenzofuran.

According to one exemplary embodiment of the present application, B is a benzene, which may be unsubstituted or substituted with an alkyl group; or naphthalene, which may be unsubstituted or substituted with an alkyl group.

According to one exemplary embodiment of the present application, C is a benzene, which may be unsubstituted or substituted with an alkyl group.

According to one exemplary embodiment of the present application, X3 and X4 are each O; S; or NR.

According to one exemplary embodiment of the present application, X3 and X4 are O.

According to one exemplary embodiment of the present application, X3 and X4 are S.

According to one exemplary embodiment of the present application, X3 and X4 are each NR.

According to one exemplary embodiment of the present application, R is hydrogen, deuterium, a halogen group, a cyano group, a substituted or unsubstituted alkyl group, a substituted or unsubstituted silyl group, a substituted or unsubstituted alkoxy group, a substituted or unsubstituted aryl group, or a substituted or unsubstituted heterocyclic group.

According to another exemplary embodiment of the present application, R is a substituted or unsubstituted alkyl group, a substituted or unsubstituted aryl group, or a substituted or unsubstituted heterocyclic group.

According to another exemplary embodiment of the present application, R is a substituted or unsubstituted aryl group.

According to another exemplary embodiment of the present application, R is a substituted or unsubstituted phenyl group; or a substituted or unsubstituted naphthyl group.

According to another exemplary embodiment of the present application, R is a phenyl group, which may be unsubstituted or substituted with an alkyl group having 1 to 10 carbon atoms; or a naphthyl group.

According to one exemplary embodiment of the present application, any of adjacent R, A, B and C groups may bond to each other to form a ring.

According to another exemplary embodiment of the present application, any of adjacent R, A, B and C groups may bond to each other to form a substituted or unsubstituted hydrocarbon ring or a substituted or unsubstituted heteroring, and the ring may be aliphatic, aromatic or a fused type thereof.

According to another exemplary embodiment of the present application, any of adjacent R, A, B and C groups may bond to each other to form a substituted or unsubstituted hydrocarbon ring having 6 to 60 carbon atoms or a substituted or unsubstituted heteroring having 2 to 60 carbon atoms, and the ring may be aliphatic, aromatic or a fused type thereof.

According to another exemplary embodiment of the present application, any of adjacent R, A, B and C groups may bond to each other to form a substituted or unsubstituted hydrocarbon ring having 6 to 30 carbon atoms or a substituted or unsubstituted heteroring having 2 to 30 carbon atoms, and the ring may be aliphatic, aromatic or a fused type thereof.

According to one exemplary embodiment of the present application, Chemical Formula 1 may be represented by Chemical Formula 1-1:

[Chemical Formula 1-1]

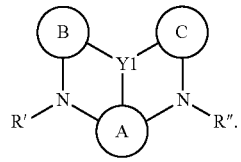

In Chemical Formula 1-1,

A, B, C and Y1 have the same definitions as in Chemical Formula 1,

R' and R" are each independently hydrogen; deuterium; a halogen group; a cyano group; a substituted or unsubstituted alkyl group; a substituted or unsubstituted silyl group; a substituted or unsubstituted alkoxy group; a substituted or unsubstituted aryl group; or a substituted or unsubstituted heterocyclic group, and any of adjacent R', R", A, B and C groups may bond to each other to form a ring.

According to one exemplary embodiment of the present application, R' and R" are each independently a substituted or unsubstituted alkyl group; a substituted or unsubstituted aryl group; or a substituted or unsubstituted heterocyclic group.

According to another exemplary embodiment of the present application, R' and R" are each independently a substituted or unsubstituted aryl group.

According to another exemplary embodiment of the present application, R' and R" are each independently a substituted or unsubstituted phenyl group; or a substituted or unsubstituted naphthyl group.

According to another exemplary embodiment of the present application, R' and R" are each independently a phenyl group, which may be unsubstituted or substituted with an alkyl group having 1 to 10 carbon atoms; or a naphthyl group.

According to one exemplary embodiment of the present application, any of adjacent R', R", A, B and C groups may bond to each other to form a ring.

According to another exemplary embodiment of the present application, any of adjacent R', R", A, B and C groups may bond to each other to form a substituted or unsubstituted hydrocarbon ring or a substituted or unsubstituted heteroring, and the ring may be aliphatic, aromatic or a fused type thereof.

According to another exemplary embodiment of the present application, any of adjacent R', R", A, B and C groups may bond to each other to form a substituted or unsubstituted hydrocarbon ring having 6 to 60 carbon atoms or a substituted or unsubstituted heteroring having 2 to 60 carbon atoms, and the ring may be aliphatic, aromatic or a fused type thereof.

According to another exemplary embodiment of the present application, any of adjacent R', R", A, B and C groups may bond to each other to form a substituted or unsubstituted hydrocarbon ring having 6 to 30 carbon atoms or a substituted or unsubstituted heteroring having 2 to 30 carbon atoms, and the ring may be aliphatic, aromatic or a fused type thereof.

According to one exemplary embodiment of the present application, Chemical Formula 1 may be represented by Chemical Formula 1-2:

[Chemical Formula 1-2]

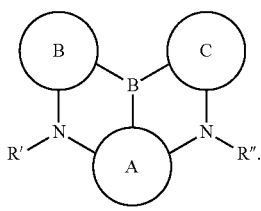

In Chemical Formula 1-2,

A, B and C have the same definitions as in Chemical Formula 1,

R' and R" are each independently a substituted or unsubstituted aryl group; or a substituted or unsubstituted heterocyclic group, and any of adjacent R', R", B and C groups may bond to each other to form a substituted or unsubstituted hydrocarbon ring or a substituted or unsubstituted heteroring, and the ring may be aliphatic, aromatic or a fused type thereof.

According to one exemplary embodiment of the present application, any of adjacent R', R", B and C groups may bond to each other to form a substituted or unsubstituted hydrocarbon ring having 6 to 60 carbon atoms or a substituted or unsubstituted heteroring having 2 to 60 carbon atoms, and the ring may be aliphatic, aromatic or a fused type thereof.

According to another exemplary embodiment of the present application, any of adjacent R', R", B and C groups may bond to each other to form a substituted or unsubstituted hydrocarbon ring having 6 to 30 carbon atoms or a substituted or unsubstituted heteroring having 2 to 30 carbon atoms, and the ring may be aliphatic, aromatic or a fused type thereof.

According to another exemplary embodiment of the present application, adjacent R' and B groups may bond to each other to form carbazole or spiro[acridine-9,9'-fluorene].

According to another exemplary embodiment of the present application, adjacent R" and C groups may bond to each other to form carbazole or spiro[acridine-9,9'-fluorene].

According to one exemplary embodiment of the present application, the compound of Chemical Formula 1 may be selected from:

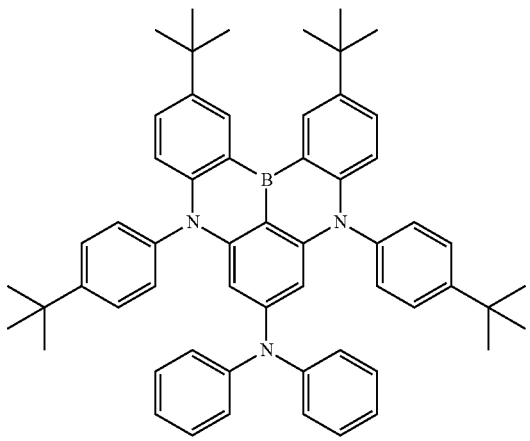

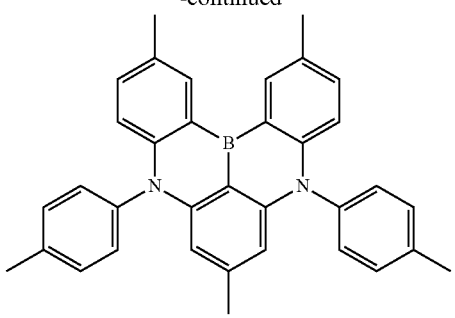

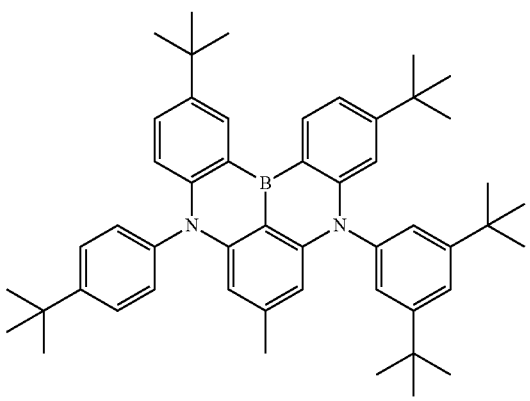

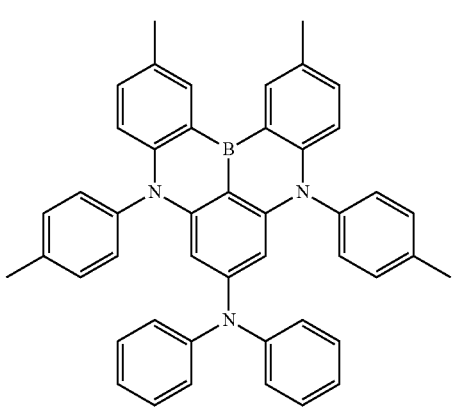

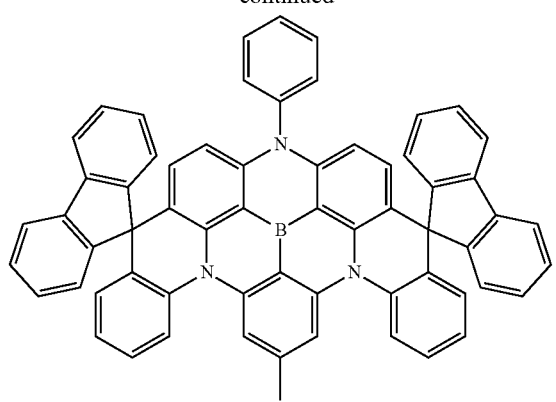
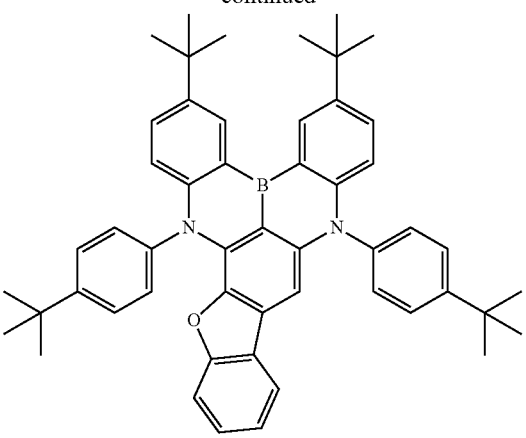
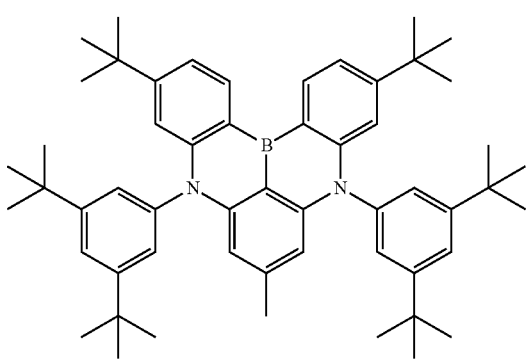
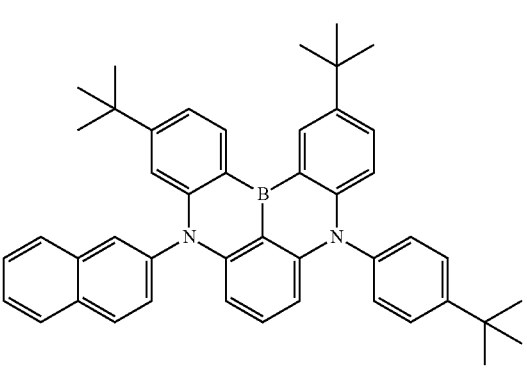
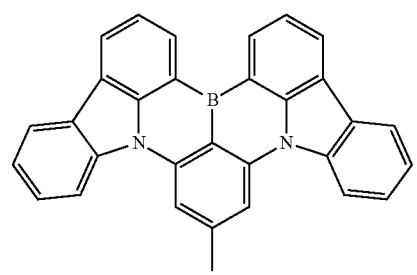
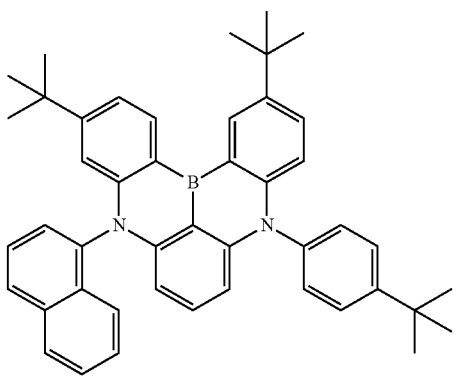
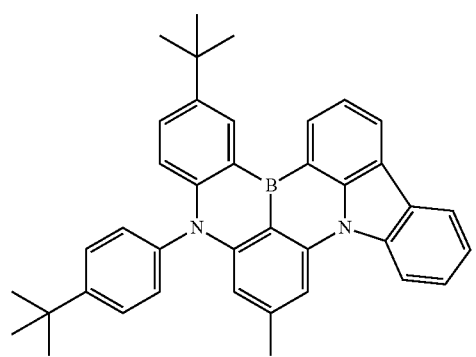
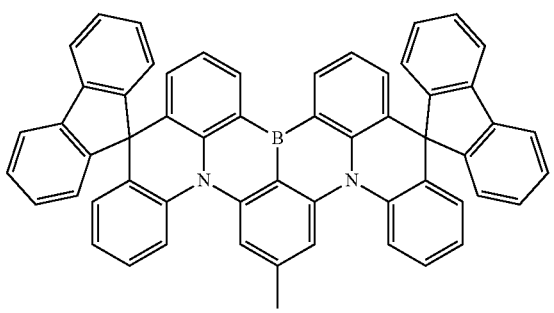

-continued
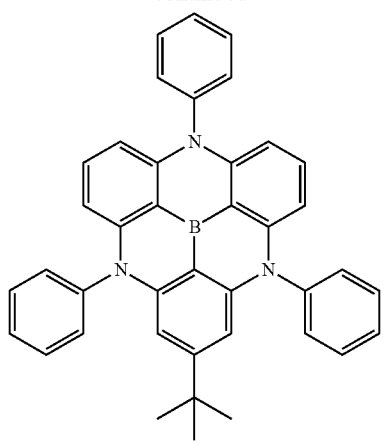
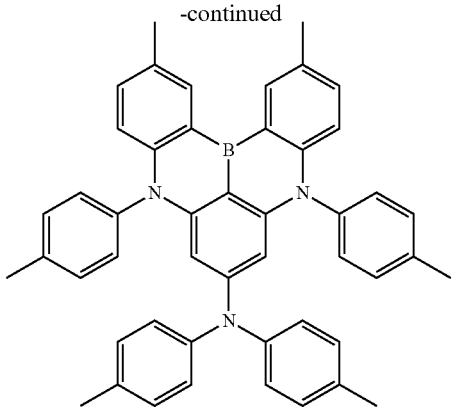
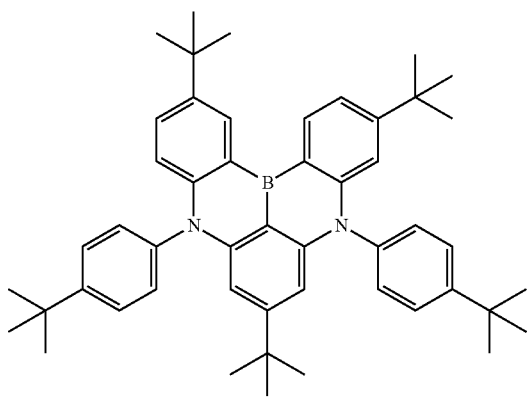
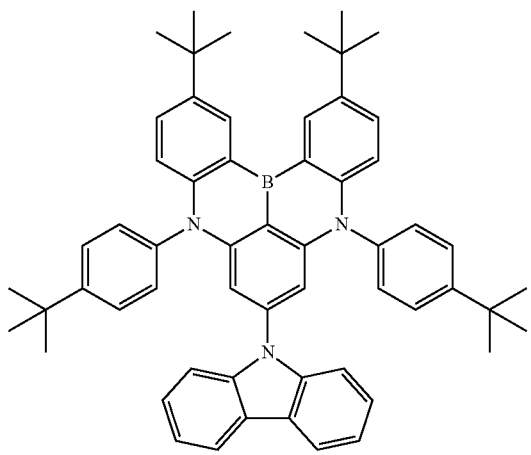
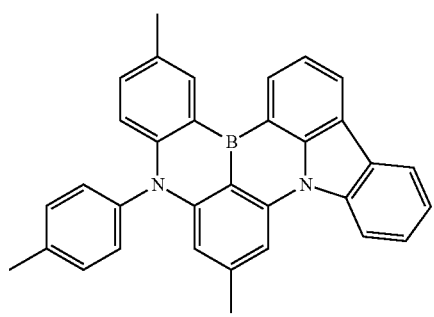
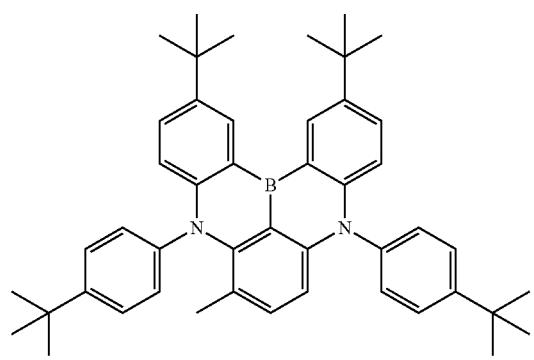
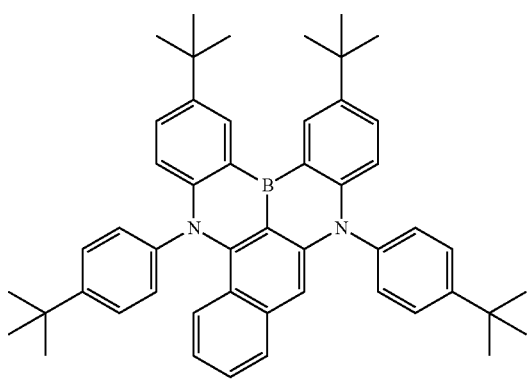
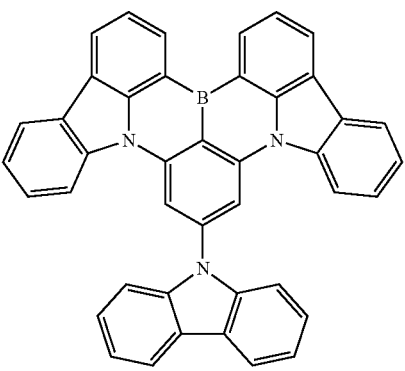

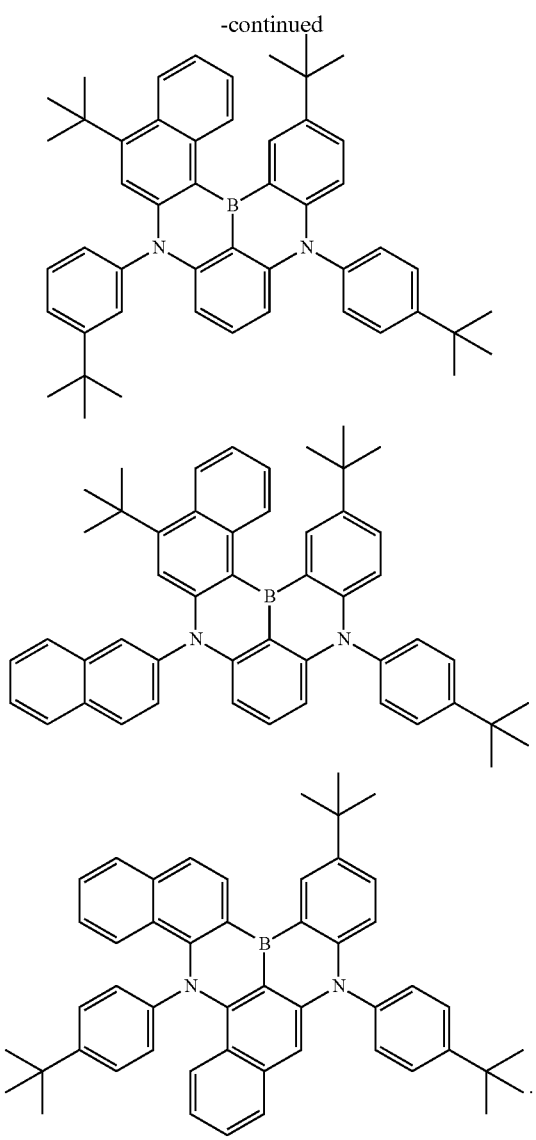

According to one exemplary embodiment of the present application, R1 to R3 are each independently hydrogen; deuterium; a halogen group; a cyano group; a substituted or unsubstituted alkyl group; a substituted or unsubstituted silyl group; a substituted or unsubstituted alkoxy group; a substituted or unsubstituted aryl group; or a substituted or unsubstituted heterocyclic group, and four or more R3s are deuterium.

According to another exemplary embodiment of the present application R1 to R3 are each independently hydrogen; deuterium; a halogen group; a substituted or unsubstituted aryl group having 6 to 60 carbon atoms; or a substituted or unsubstituted heterocyclic group having 2 to 60 carbon atoms, and four or more R3s are deuterium.

According to another exemplary embodiment of the present application R1 to R3 are each independently hydrogen; deuterium; a halogen group; a substituted or unsubstituted aryl group having 6 to 30 carbon atoms; or a substituted or unsubstituted heterocyclic group having 2 to 30 carbon atoms, and four or more R3s are deuterium.

According to another exemplary embodiment of the present application R1 to R3 are each independently hydrogen; deuterium; a halogen group; a substituted or unsubstituted aryl group having 6 to 15 carbon atoms; or a substituted or unsubstituted heterocyclic group having 2 to 15 carbon atoms, and four or more R3s are deuterium.

According to one exemplary embodiment of the present application, R1 to R3 are each independently hydrogen; deuterium; or an aryl group, which may be unsubstituted or substituted with deuterium, and four or more R3s are deuterium.

According to one exemplary embodiment of the present application, R1 to R3 are each independently hydrogen; deuterium; or an aryl group having 6 to 30 carbon atoms, which may be unsubstituted or substituted with deuterium, and four or more R3s are deuterium.

According to one exemplary embodiment of the present application, R1 to R3 are each independently hydrogen; deuterium; or an aryl group having 6 to 15 carbon atoms, which may be unsubstituted or substituted with deuterium, and four or more R3s are deuterium.

According to one exemplary embodiment of the present application, R1 to R3 are each independently hydrogen; deuterium; a phenyl group, which may be unsubstituted or substituted with deuterium; or a naphthyl group, which may be unsubstituted or substituted with deuterium, and four or more R3s are deuterium.

According to one exemplary embodiment of the present application, four or more R3s are deuterium.

According to one exemplary embodiment of the present application, six or more R3s may be deuterium.

According to one exemplary embodiment of the present application, seven or more R3s may be deuterium.

According to one exemplary embodiment of the present application, when four R3s are deuterium, position Nos. 1 to 4 and position Nos. 5 to 8 of the anthracene may be substituted with two deuteriums each.

According to one exemplary embodiment of the present application, when four R3s are deuterium, either position Nos. 1 to 4 or position Nos. 5 to 8 of the anthracene may be substituted with deuterium.

According to one exemplary embodiment of the present application, when c is 8 and seven R3s are deuterium, the remaining R3 may be an aryl group, which may be unsubstituted or substituted with deuterium.

According to one exemplary embodiment of the present application, when c is 8 and seven R3s are deuterium, the remaining R3 may be a phenyl group, which may be unsubstituted or substituted with deuterium; or a naphthyl group, which may be unsubstituted or substituted with deuterium.

According to one exemplary embodiment of the present application, c is 8 and all R3s may be deuterium.

According to one exemplary embodiment of the present application, R1 and R2 may be hydrogen.

According to one exemplary embodiment of the present application, R1 may be hydrogen, and R2 may be deuterium.

According to one exemplary embodiment of the present application, R1 may be deuterium, and R2 may be hydrogen.

According to one exemplary embodiment of the present application, R1 and R2 may be deuterium.

According to one exemplary embodiment of the present application, four or more R1s may be deuterium.

According to one exemplary embodiment of the present application, five or more R1s may be deuterium.

According to one exemplary embodiment of the present application, six or more R1s may be deuterium.

According to one exemplary embodiment of the present application, a is 7, and all R1s may be deuterium.

According to one exemplary embodiment of the present application, four or more R2s may be deuterium.

According to one exemplary embodiment of the present application, five or more R2s may be deuterium.

According to one exemplary embodiment of the present application, six or more R2s may be deuterium.

According to one exemplary embodiment of the present application, b is 7, and all R2s may be deuterium.

According to one exemplary embodiment of the present application, the compound of Chemical Formula 2 is selected from:

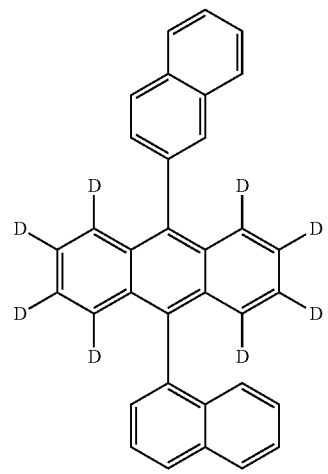

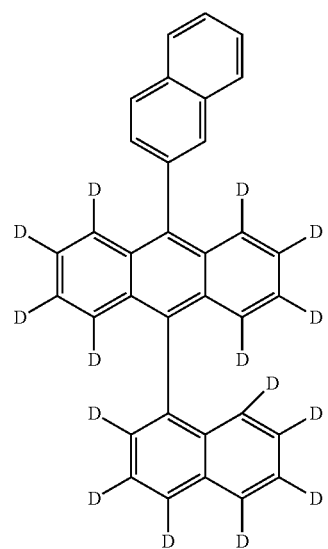

-continued

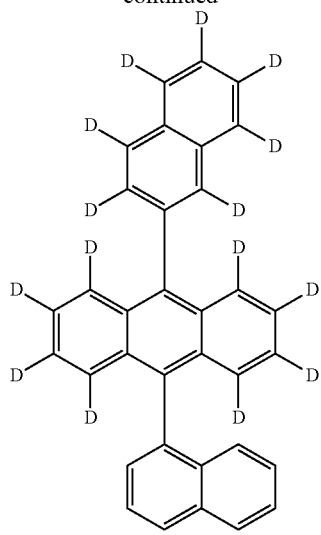

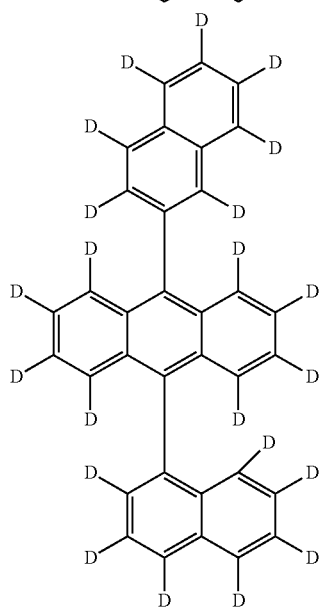

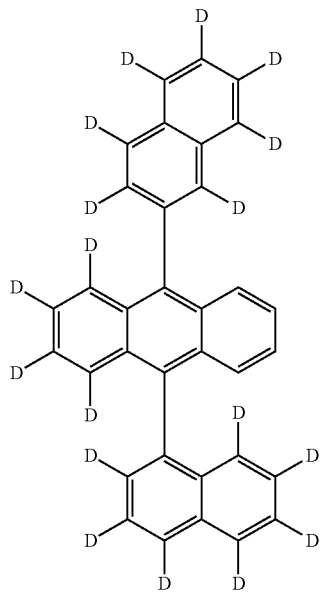

-continued
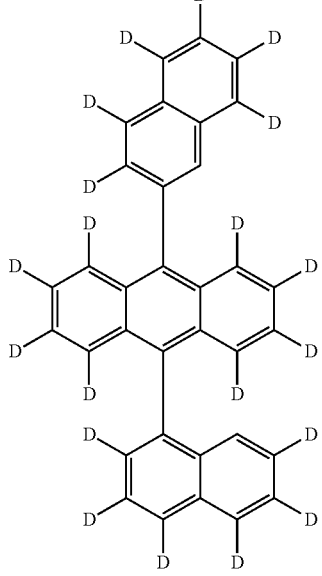
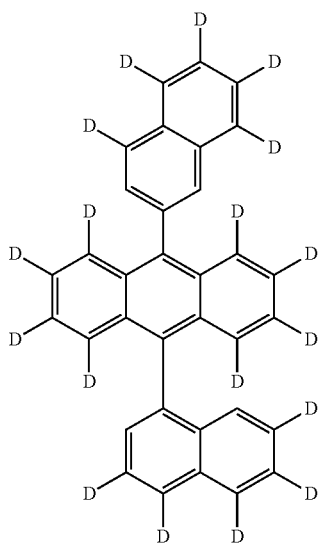
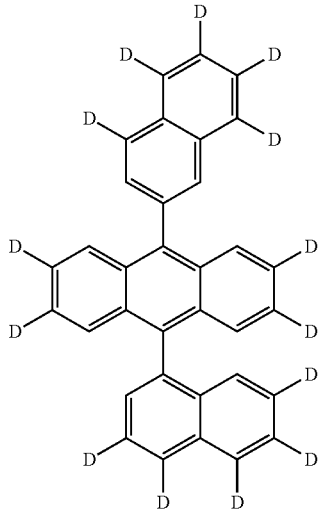
-continued
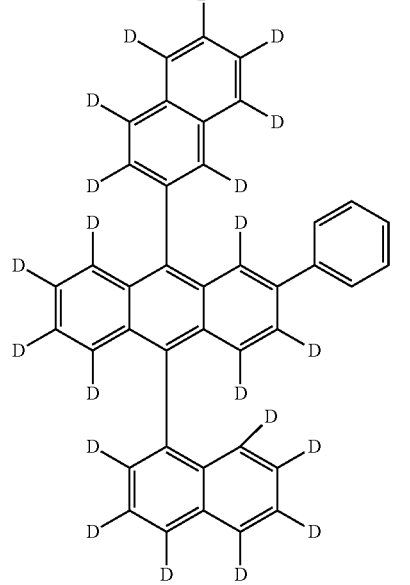
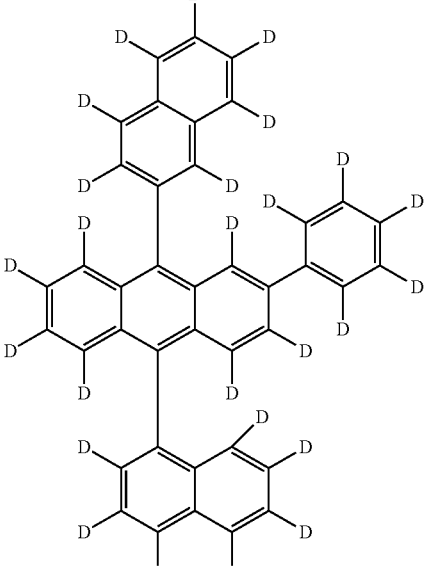
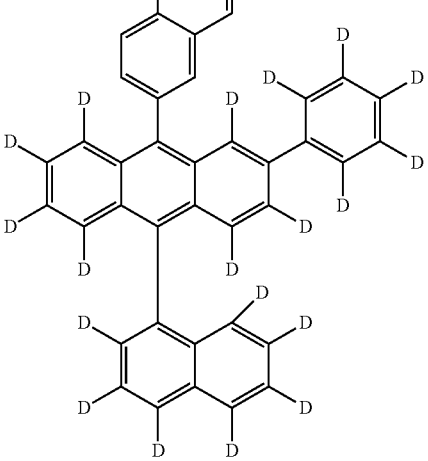

-continued
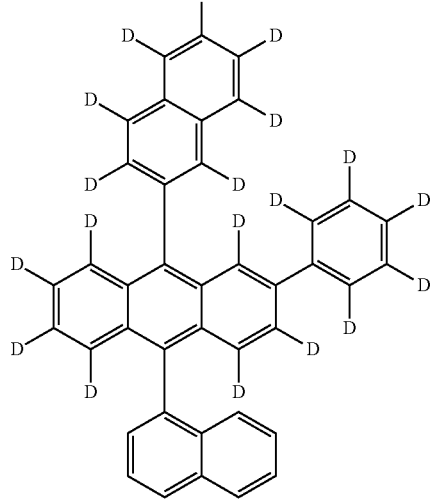
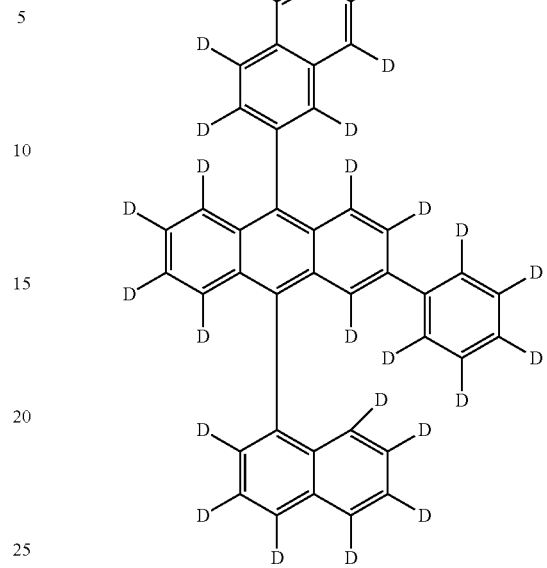
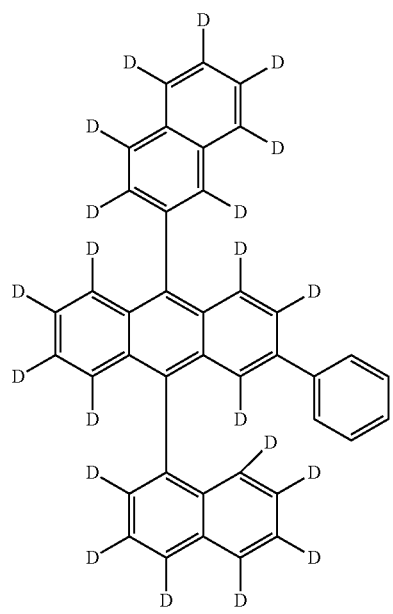
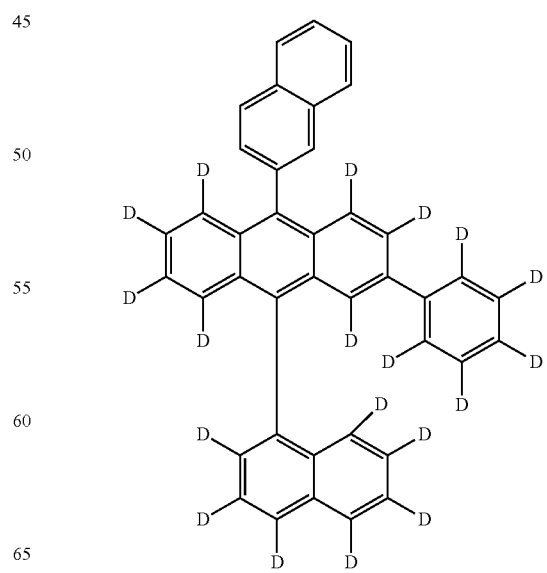

-continued
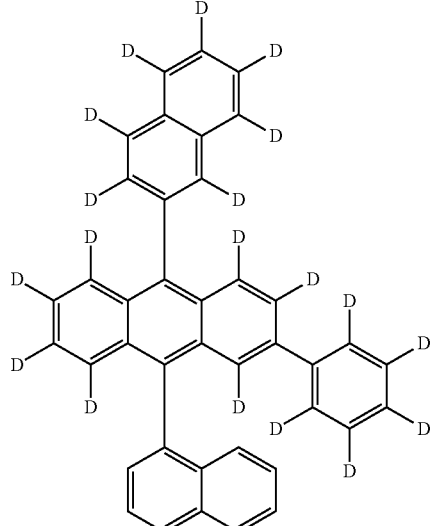
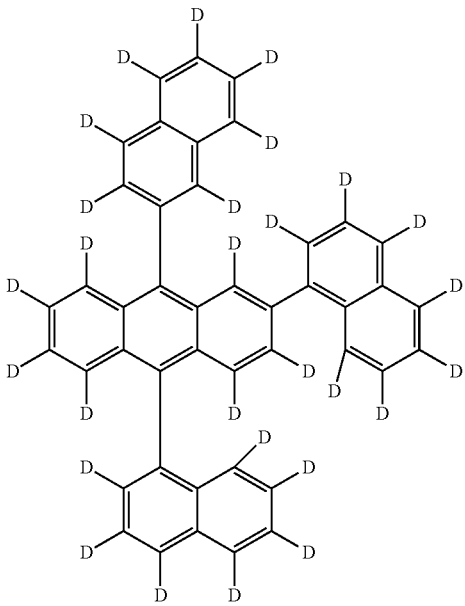
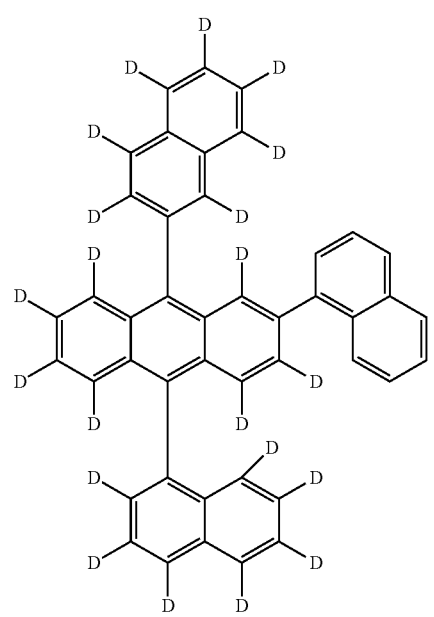
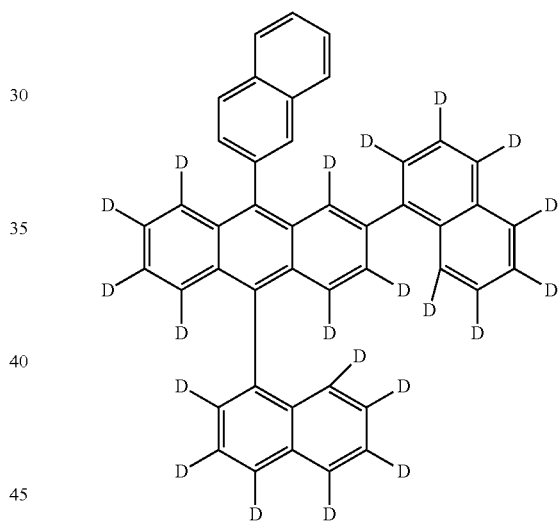
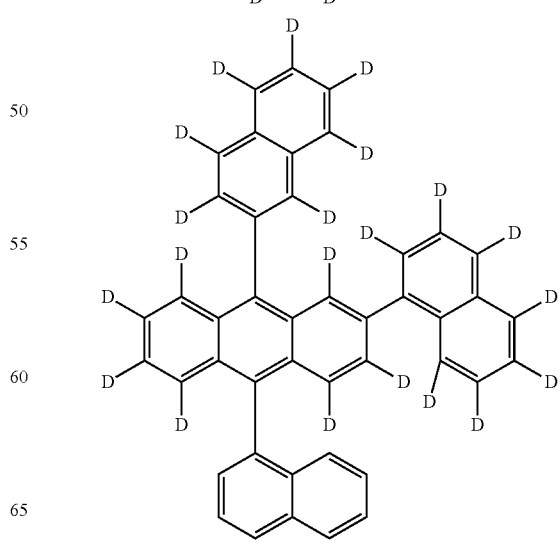

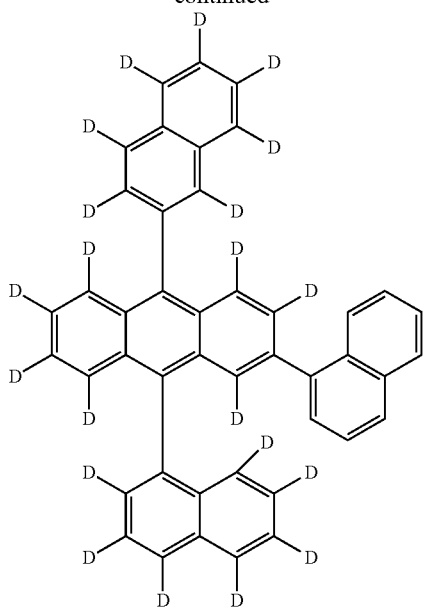

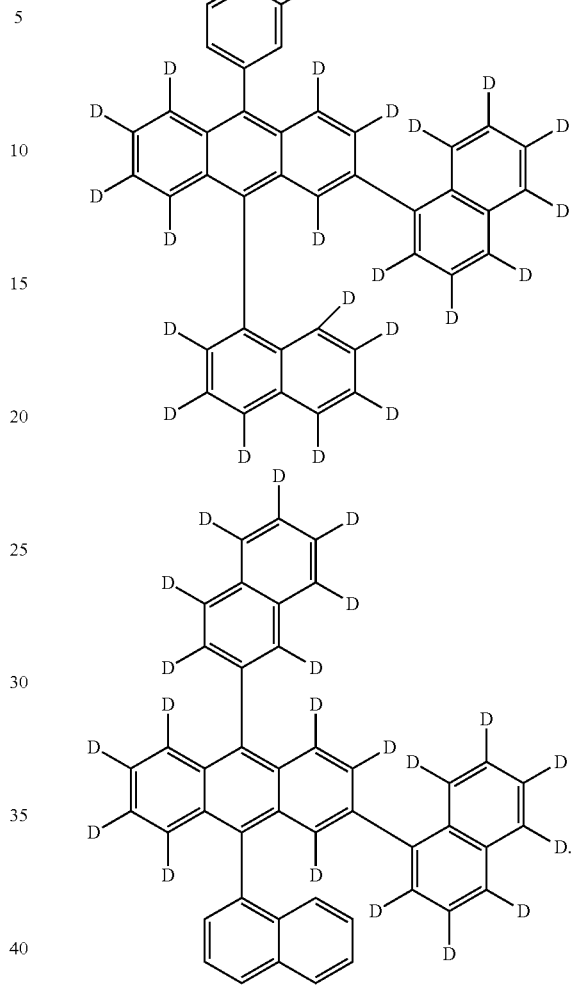

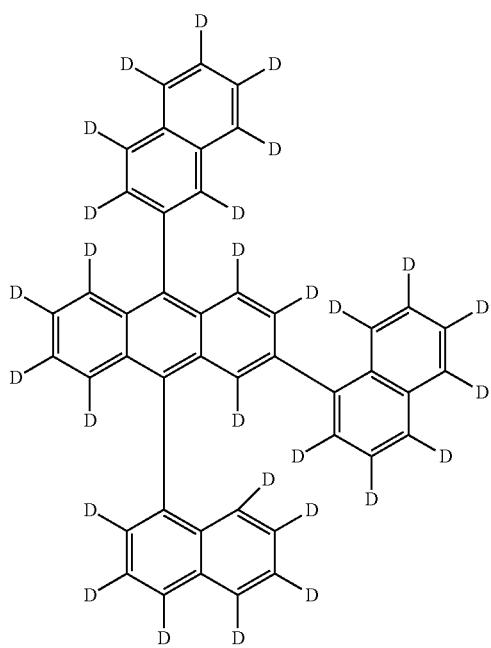

In the present application, a description of a certain member being placed "on" another member includes not only a case where one member is in contact with another member but also a case where yet another member is present between the two members.

In the present application, a description of a certain part "including" certain constituents means capable of further including other constituents, and does not exclude other constituents unless particularly stated to the contrary.

The organic material layer of the organic light emitting device of the present application may be formed in a single layer structure, but may be formed in a multilayer structure in which two or more organic material layers are laminated. For example, the organic light emitting device of the present disclosure may include an organic material layer having a structure including a hole injection layer, a hole transfer layer, a light emitting layer, an electron transfer layer, an electron injection layer and the like. However, the structure of the organic light emitting device is not limited thereto, and may include a smaller number of organic layers.

In one exemplary embodiment of the present application, the organic light emitting device further includes one, two or more layers selected from the group consisting of a hole injection layer, a hole transfer layer, an electron transfer layer, an electron injection layer, an electron blocking layer and a hole blocking layer.

In one exemplary embodiment of the present application, the organic light emitting device includes a first electrode; a second electrode provided opposite to the first electrode; and one or more organic material layers provided between the first electrode and the second electrode, wherein one or more layers of the one or more organic material layers include the compound of Chemical Formula 1 and the compound of Chemical Formula 2.

In one exemplary embodiment of the present application, one or more from the group consisting of a light emitting layer, a hole transfer layer, a hole injection layer, a layer carrying out hole transfer and hole injection at the same time, and an electron blocking layer may be selected as the one or more organic material layers.

In one exemplary embodiment of the present application, the organic material layer includes a light emitting layer, and the light emitting layer includes the compound of Chemical Formula 1 and the compound of Chemical Formula 2.

The light emitting layer may include the compound of Chemical Formula 1 as a dopant material, and the compound of Chemical Formula 2 as a host material.

In one exemplary embodiment of the present application, the compound of Chemical Formula 1 and the compound of Chemical Formula 2 may have a weight ratio of 1:99 to 50:50, preferably 1:99 to 10:90, and more preferably 3:97 to 7:93.

In another exemplary embodiment, the organic light emitting device may have a structure in which an anode, one or more organic material layers and a cathode are consecutively laminated on a substrate (normal type).

In another exemplary embodiment, the organic light emitting device may have a structure in which a cathode, one or more organic material layers and an anode are consecutively laminated on a substrate (inverted type).

For example, the structure of an organic light emitting device according to one exemplary embodiment of the present application is illustrated in FIGS. 1 and 2.

FIG. 1 illustrates an organic light emitting device in which a substrate (1), an anode (2), a light emitting layer (3) and a cathode (4) are consecutively laminated. In this arrangement, the compound of Chemical Formula 1 and the compound of Chemical Formula 2 may be included in the light emitting layer (3).

FIG. 2 illustrates an organic light emitting device in which a substrate (1), an anode (2), a hole injection layer (5), a hole transfer layer (6), a light emitting layer (3), an electron transfer layer (7), an electron injection layer (8) and a cathode (4) are consecutively laminated. In this arrangement, the compound of Chemical Formula 1 and the compound of Chemical Formula 2 may be included in the light emitting layer (3).

In one exemplary embodiment of the present application, the organic material layer including the compound of Chemical Formula 1 and the compound of Chemical Formula 2 has a thickness of 10 Å to 500 Å.

The organic light emitting device of the present application may be manufactured using materials and methods known in the art, except that one or more layers of the organic material layers include the compound of the present application, that is, the compound of Chemical Formula 1 and the compound of Chemical Formula 2.

When the organic light emitting device includes a plurality of organic material layers, the materials of the plurality of organic material layers may be the same as or different from each other.

For example, the organic light emitting device of the present application may be manufactured by consecutively laminating a first electrode, an organic material layer and a second electrode on a substrate. Herein, the organic light emitting device may be manufactured by forming an anode on a substrate by depositing a metal, a metal oxide having conductivity, or an alloy thereof using a physical vapor deposition (PVD) method such as sputtering or e-beam evaporation, forming an organic material layer including a hole injection layer, a hole transfer layer, a light emitting layer and an electron transfer layer thereon, and then depositing a material capable of being used as a cathode thereon. In addition to such a method, the organic light emitting device may also be manufactured by consecutively depositing a cathode material, an organic material layer and an anode material on a substrate.

In addition, the organic material layer comprising the compound of Chemical Formula 1 and the compound of Chemical Formula 2 may be formed using a solution coating method as well as a vacuum deposition method when manufacturing the organic light emitting device. Herein, the solution coating method means spin coating, dip coating, doctor blading, ink jet printing, screen printing, a spray method, roll coating and the like, but is not limited thereto.

In addition to such methods, the organic light emitting device may also be manufactured by consecutively depositing a cathode material, an organic material layer and an anode material on a substrate (International Patent Application Laid-Open Publication No. 2003/012890). However, the manufacturing method is not limited thereto.

In one exemplary embodiment of the present application, the first electrode is an anode, and the second electrode is a cathode.

In another exemplary embodiment, the first electrode is a cathode, and the second electrode is an anode.

As the anode material, materials having large work function are normally preferred so that hole injection into an organic material layer is smooth. Specific examples of the anode material capable of being used in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; and conductive polymers such as poly(3-methylthiophene), poly[3,4-(ethylene-1,2-dioxy)thiophene](PEDOT), polypyrrole and polyaniline, but are not limited thereto.

As the cathode material, materials having small work function are normally preferred so that electron injection into an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The hole injection layer is a layer that injects holes from an electrode, and the hole injection material is preferably a compound that has an ability to transfer holes, therefore, has a hole injection effect in an anode, has an excellent hole injection effect for a light emitting layer or a light emitting material, prevents excitons generated in the light emitting layer from moving to an electron injection layer or an electron injection material, and in addition thereto, has an excellent thin film forming ability. The highest occupied molecular orbital (HOMO) of the hole injection material is preferably in-between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer is a layer receiving holes from a hole injection layer and transferring the holes to a light emitting layer, and materials capable of receiving holes from an anode or a hole injection layer, moving the holes to a light emitting layer, and having high mobility for the holes may be used as the hole transfer material. Specific examples thereof include arylamine-based organic materials, conductive polymers, block copolymers having conjugated parts and non-conjugated parts together, and the like, but are not limited thereto.

The light emitting material is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxy-quinoline aluminum complexes (Alq$_3$); carbazole-based compounds; dimerized styryl compounds; BAlq; 10-hydroxybenzoquinoline-metal compounds; benzoxazole, benzothiazole and benzimidazole-based compounds; poly(p-phenylenevinylene) (PPV)-based polymers; spiro compounds; polyfluorene; rubrene, and the like, but are not limited thereto.

The electron transfer layer is a layer receiving electrons from an electron injection layer and transferring the electrons to a light emitting layer, and materials capable of favorably receiving electrons from a cathode, moving the electrons to a light emitting layer, and having high mobility for the electrons may be used as the electron transfer material. Specific examples thereof include Al complexes of 8-hydroxyquinoline; complexes including Alq$_3$; organic radical compounds; hydroxyflavon-metal complexes, and the like, but are not limited thereto. The electron transfer layer may be used together with any desired cathode material as used in the art. Particularly, examples of a suitable cathode material may include common materials having low work function with an additional aluminum or silver layer. Specifically, cesium, barium, calcium, ytterbium and samarium are included, and in each case, an additional aluminum or silver layer is included.

The electron injection layer is a layer injecting electrons from an electrode, and compounds having an electron transferring ability, having the ability to inject electrons from a cathode into a light emitting layer or light emitting material, and preventing excitons generated in the light emitting layer from moving to a hole injection layer, and in addition thereto, having an excellent thin film forming ability are preferred. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The metal complex compound includes 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato) gallium, bis(10-hydroxybenzo[h]quinolinato)beryllium, bis (10-hydroxybenzo[h]quinolinato)zinc, bis(2-methyl-8-quinolinato)chlorogallium, bis(2-methyl-8-quinolinato) (o-cresolato)gallium, bis(2-methyl-8-quinolinato) (1-naphtholato)aluminum, bis(2-methyl-8-quinolinato) (2-naphtholato)gallium and the like, but is not limited thereto.

The hole blocking layer is a layer blocking holes from reaching a cathode, and may be generally formed under the same conditions as the hole injection layer. Specific examples thereof may include oxadiazole derivatives, triazole derivatives, phenanthroline derivatives, BCP, aluminum complexes and the like, but are not limited thereto.

The organic light emitting device according to the present specification may be a top-emission type, a bottom-emission type or a dual-emission type depending on the materials used.

Manufacturing of the organic light emitting device including the compound of Chemical Formula 1 and the compound of Chemical Formula 2 will be specifically described in the following examples. However, the following examples are for illustrative purposes only, and the scope of the present specification is not limited thereto.

PREPARATION EXAMPLE

<Preparation Example 1> Preparation of Compound BH-A

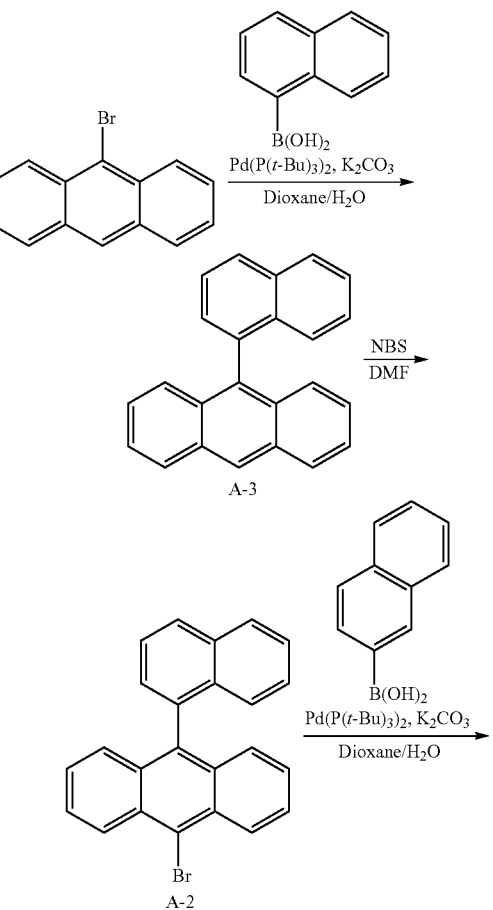

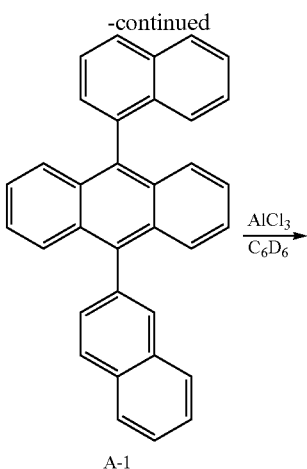

A-1

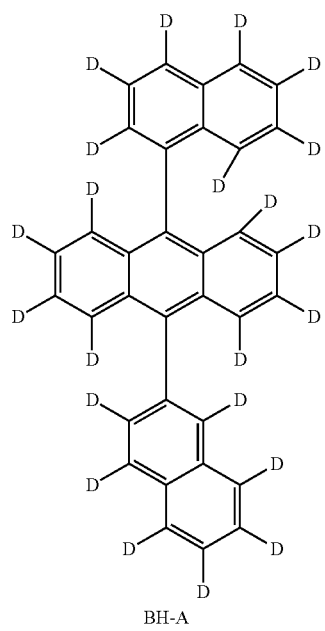

BH-A 1-1) Preparation of Compound A-3

In a 3-neck flask, 9-bromoanthracene (50.0 g, 194 mmol) and naphthalene-1-boronic acid (36.79 g, 214 mmol) were dissolved in 1,4-dioxane (500 ml), and $K_2CO_3$ (80.6 g, 583 mmol) dissolved in $H_2O$ (200 ml) was introduced thereto. $Pd(P(t-Bu)_3)_2$ (1.98 g, 3.9 mmol) was introduced thereto, and the result was stirred for 5 hours under an argon atmosphere reflux condition. When the reaction was finished, the reaction solution was cooled to room temperature, then transferred to a separatory funnel, and extracted with water and toluene. The extract was dried with $MgSO_4$, then filtered and concentrated, and the sample was purified using silica gel column chromatography to obtain Compound A-3 (49.8 g). (Yield 84%, MS[M+H]$^+$=305)

1-2) Preparation of Compound A-2

To a 2-neck flask, Compound A-3 (20.0 g, 65.7 mmol), N-bromosuccinimide (NBS) (11.8 g, 65.7 mmol) and dimethylformamide (DMF) (300 ml) were introduced, and the result was stirred for 10 hours at room temperature under the argon atmosphere. After the reaction was finished, the reaction solution was transferred to a separatory funnel, and the organic layer was extracted with water and ethyl acetate.

The extract was dried with $MgSO_4$, then filtered and concentrated, and the sample was purified using silica gel column chromatography to obtain Compound A-2 (18.5 g). (Yield 74%, MS[M+H]$^+$=383)

1-3) Preparation of Compound A-1

In a 3-neck flask, Compound A-2 (20.0 g, 52.2 mmol) and naphthalene-2-boronic acid (9.9 g, 57.4 mmol) were dissolved in 1,4-dioxane (300 ml), and $K_2CO_3$ (14.4 g, 104 mmol) dissolved in $H_2O$ (100 ml) was introduced thereto. $Pd(P(t-Bu)_3)_2$ (0.27 g, 0.52 mmol) was introduced thereto, and the result was stirred for 5 hours under an argon atmosphere reflux condition. When the reaction was finished, the reaction solution was cooled to room temperature, then transferred to a separatory funnel, and extracted with water and toluene. The extract was dried with $MgSO_4$, then filtered and concentrated, and the sample was purified using silica gel column chromatography to obtain Compound A-1 (11.9 g). (Yield 52%, MS[M+H]$^+$=431)

1-4) Synthesis of Compound BH-A

Compound A-1 (20 g) and $AlCl_3$ (4 g) were introduced to $C_6D_6$ (300 ml), and stirred for 2 hours. After the reaction was finished, $D_2O$ (50 ml) was introduced thereto, and after stirring the result for 30 minutes, trimethylamine (6 ml) was added dropwise thereto. The reaction solution was transferred to a separatory funnel, and extracted with water and toluene. The extract was dried with $MgSO_4$, and recrystallized with ethyl acetate to obtain Compound BH-A (15.2 g). (Yield 72%, MS[M+H]$^+$=452).

<Preparation Example 2> Preparation of Compound BH-B

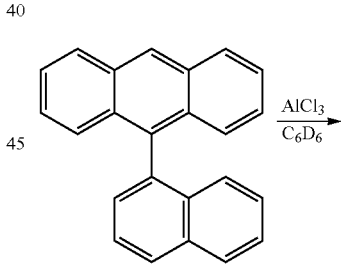

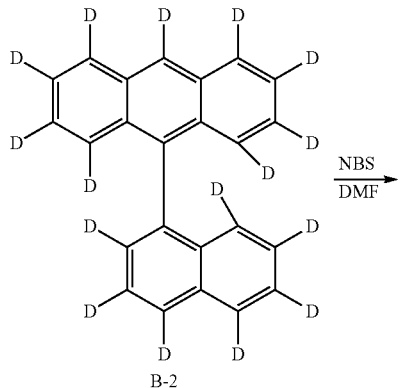

B-2

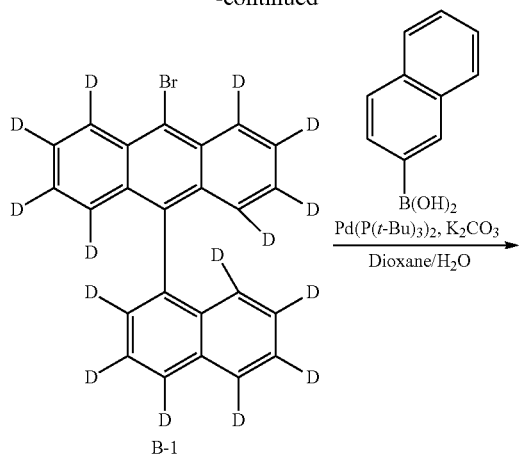

B-1

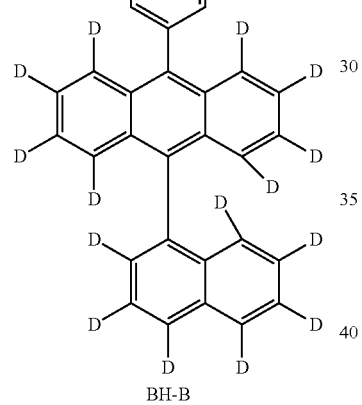

BH-B 2-1) Preparation of Compound B-2

Compound B-2 (13.3 g) was obtained by progressing a synthesis in the same manner as in Preparation Example 1-4 except that 9-(naphthalen-1-yl)anthracene was used instead of Compound A-1 in Preparation Example 1-4. (Yield 63%, MS[M+H]$^+$=321)

2-2) Preparation of Compound B-1

Compound B-1 (17.4 g) was obtained by progressing a synthesis in the same manner as in Preparation Example 1-2 except that Compound B-2 was used instead of Compound A-3 in Preparation Example 1-2. (Yield 70%, MS[M+H]$^+$=398)

2-3) Preparation of Compound BH-B

Compound BH-B (10.0 g) was obtained by progressing a synthesis in the same manner as in Preparation Example 1-3 except that Compound B-1 was used instead of Compound A-2 in Preparation Example 1-3. (Yield 45%, MS[M+H]$^+$=446)

<Preparation Example 3> Preparation of Compound BH-C

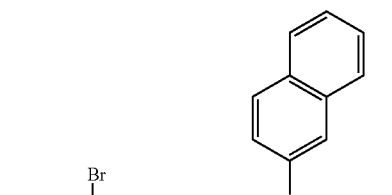

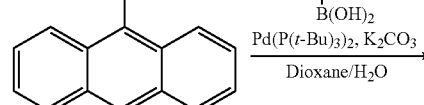

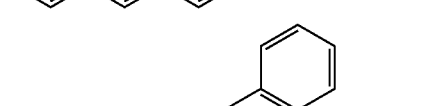

C-3

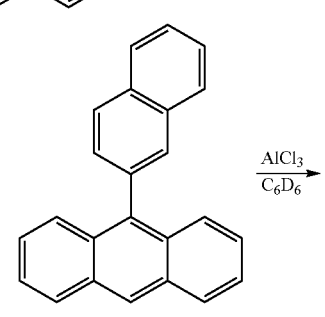

C-2

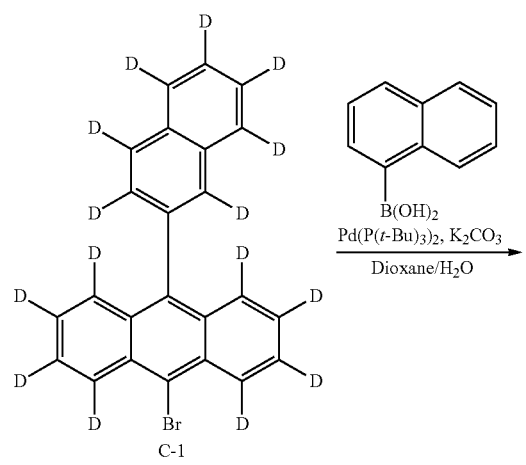

C-1

Preparation Example 4: Preparation of Compound BH-D

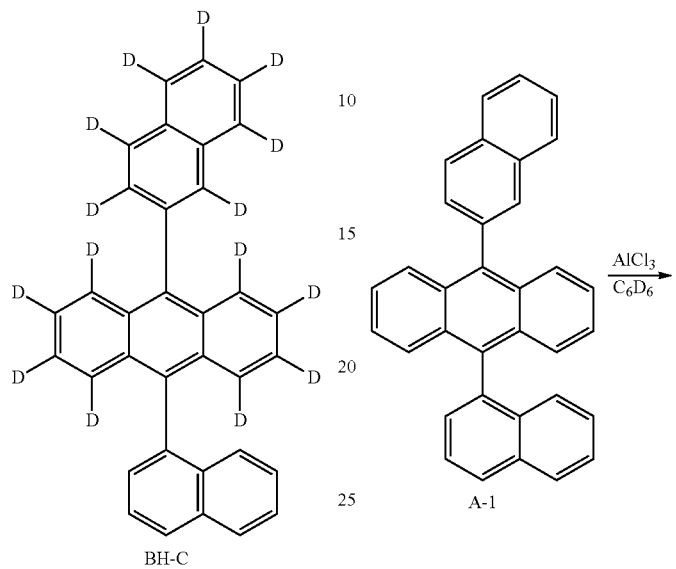

BH-C 3-1) Preparation of Compound C-3

Compound C-3 (48.7 g) was obtained by progressing a synthesis in the same manner as in Preparation Example 1-1 except that naphthalene-2-boronic acid was used instead of naphthalene-1-boronic acid in Preparation Example 1-1. (Yield 80%, MS[M+H]$^+$=305)

3-2) Preparation of Compound C-2

Compound C-2 (13.5 g) was obtained by progressing a synthesis in the same manner as in Preparation Example 1-4 except that Compound C-3 was used instead of Compound A-1 in Preparation Example 1-4. (Yield 64%, MS[M+H]$^+$=321)

3-3) Preparation of Compound C-1

Compound C-1 (19.0 g) was obtained by progressing a synthesis in the same manner as in Preparation Example 1-2 except that Compound C-2 was used instead of Compound A-3 in Preparation Example 1-2. (Yield 76%, MS[M+H]$^+$=399)

3-4) Preparation of Compound BH-C

Compound BH-C (12.8 g) was obtained by progressing a synthesis in the same manner as in Preparation Example 1-3 except that Compound C-1 was used instead of Compound A-2 in Preparation Example 1-3 and naphthalene-1-boronic acid was used instead of naphthalene-2-boronic acid. (Yield 52%, MS [M+H]$^+$=446)

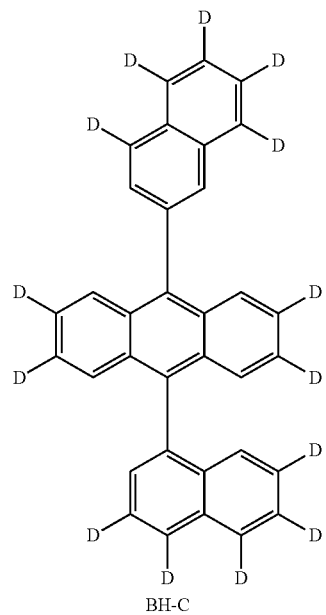

BH-C

Compound A-1 (20 g) and AlCl$_3$ (2 g) were introduced to C$_6$D$_6$ (150 ml), and stirred for 2 hours. After the reaction was finished, D$_2$O (50 ml) was introduced thereto, and after stirring the result for 30 minutes, trimethylamine (6 ml) was added dropwise thereto. The reaction solution was transferred to a separatory funnel, and extracted with water and toluene. The extract was dried with MgSO$_4$, and recrystallized with ethyl acetate to obtain Compound BH-D (13.3 g). (Yield 64%, MS [M+H]$^+$=445)

<Preparation Example 5> Preparation of Compound BH-E

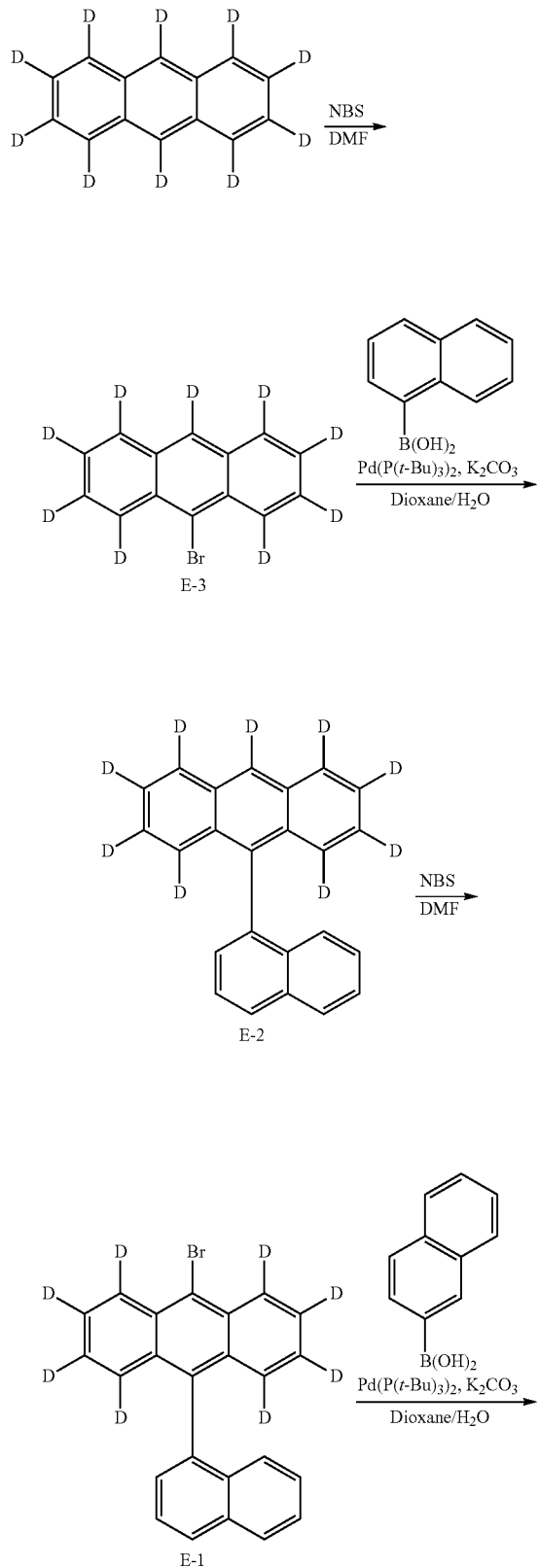

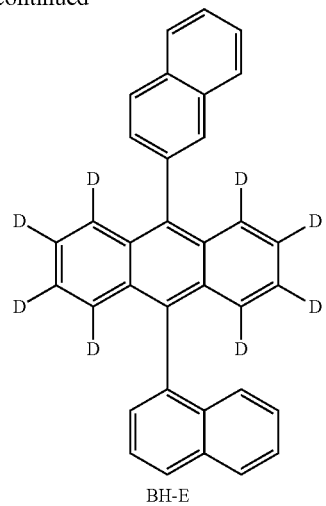

BH-E 5-1) Preparation of Compound E-3

To a 2-neck flask, an anthracene-$d_{10}$ compound (Aldrich, 20.0 g, 106 mmol), N-bromosuccinimide (NBS) (18.9 g, 106 mmol) and dimethylformamide (DMF) (300 ml) were introduced, and the result was stirred for 10 hours at room temperature under the argon atmosphere. After the reaction was finished, the reaction solution was transferred to a separatory funnel, and the organic layer was extracted with water and ethyl acetate. The extract was dried with $MgSO_4$, then filtered and concentrated, and the sample was purified using silica gel column chromatography to obtain Compound E-3 (15.6 g). (Yield 55%, MS[M+H]$^+$=267)

5-2) Preparation of Compound E-2

Compound E-2 (19.7 g) was obtained by progressing a synthesis in the same manner as in Preparation Example 1-1 except that Compound E-3 (20.0 g, 75.1 mmol) was used instead of 9-bromoanthracene in Preparation Example 1-1. (Yield 84%, MS [M+H]$^+$=314)

5-3) Preparation of Compound E-1

Compound E-1 (18.1 g) was obtained by progressing a synthesis in the same manner as in Preparation Example 1-2 except that Compound E-2 was used instead of Compound A-3 in Preparation Example 1-2. (Yield 72%, MS[M+H]$^+$=391)

5-4) Preparation of Compound BH-E

Compound BH-E (10.6 g) was obtained by progressing a synthesis in the same manner as in Preparation Example 1-3 except that Compound E-1 was used instead of Compound A-2 in Preparation Example 1-3. (Yield 47%, MS[M+H]$^+$=439)

<Preparation Example 6> Preparation of Compound BH-F

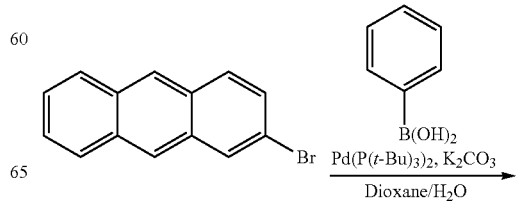

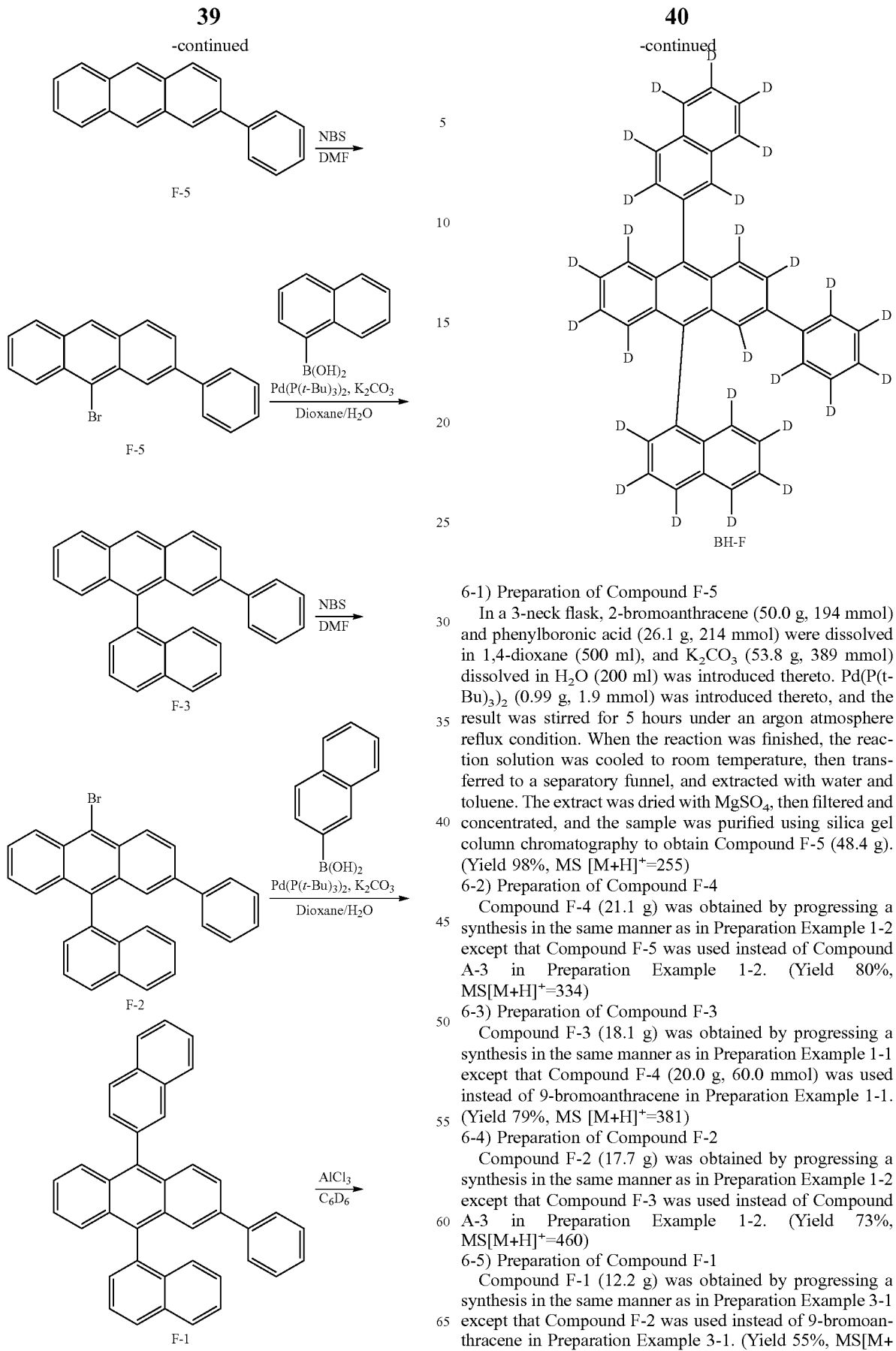

6-1) Preparation of Compound F-5

In a 3-neck flask, 2-bromoanthracene (50.0 g, 194 mmol) and phenylboronic acid (26.1 g, 214 mmol) were dissolved in 1,4-dioxane (500 ml), and $K_2CO_3$ (53.8 g, 389 mmol) dissolved in $H_2O$ (200 ml) was introduced thereto. $Pd(P(t-Bu)_3)_2$ (0.99 g, 1.9 mmol) was introduced thereto, and the result was stirred for 5 hours under an argon atmosphere reflux condition. When the reaction was finished, the reaction solution was cooled to room temperature, then transferred to a separatory funnel, and extracted with water and toluene. The extract was dried with $MgSO_4$, then filtered and concentrated, and the sample was purified using silica gel column chromatography to obtain Compound F-5 (48.4 g). (Yield 98%, MS $[M+H]^+=255$)

6-2) Preparation of Compound F-4

Compound F-4 (21.1 g) was obtained by progressing a synthesis in the same manner as in Preparation Example 1-2 except that Compound F-5 was used instead of Compound A-3 in Preparation Example 1-2. (Yield 80%, MS$[M+H]^+=334$)

6-3) Preparation of Compound F-3

Compound F-3 (18.1 g) was obtained by progressing a synthesis in the same manner as in Preparation Example 1-1 except that Compound F-4 (20.0 g, 60.0 mmol) was used instead of 9-bromoanthracene in Preparation Example 1-1. (Yield 79%, MS $[M+H]^+=381$)

6-4) Preparation of Compound F-2

Compound F-2 (17.7 g) was obtained by progressing a synthesis in the same manner as in Preparation Example 1-2 except that Compound F-3 was used instead of Compound A-3 in Preparation Example 1-2. (Yield 73%, MS$[M+H]^+=460$)

6-5) Preparation of Compound F-1

Compound F-1 (12.2 g) was obtained by progressing a synthesis in the same manner as in Preparation Example 3-1 except that Compound F-2 was used instead of 9-bromoanthracene in Preparation Example 3-1. (Yield 55%, MS$[M+H]^+=507$)

6-6) Preparation of Compound BH-F

Compound BH-F (16.6 g) was obtained by progressing a synthesis in the same manner as in Preparation Example 1-4 except that Compound F-1 was used instead of Compound A-1 in Preparation Example 1-4. (Yield 79%, MS[M+H]$^+$=533)

<Preparation Example 7> Preparation of Compound BD-A

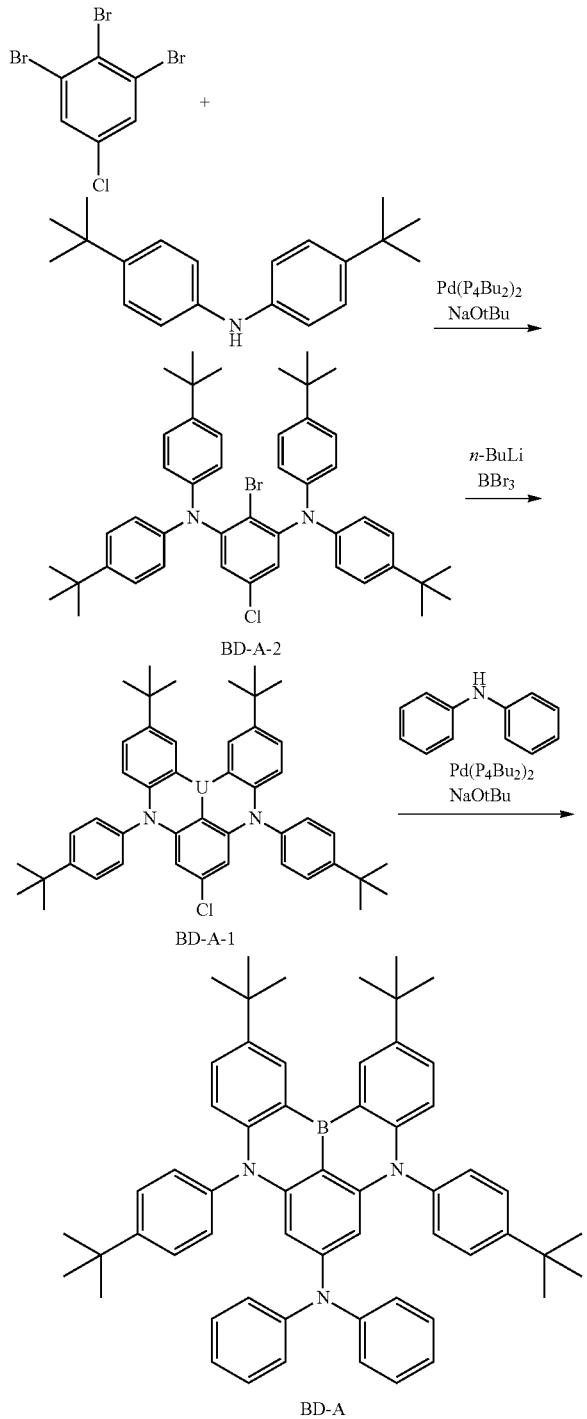

7-1) Preparation of Compound BD-A-2

In a 3-neck flask, 1,2,3-tribromo-5-chlorobenzene (5 g), bis-(4-(tert-butyl)phenyl)amine (8 g), Pd(P-tBu$_3$)$_2$ (0.15 g) and NaOtBu (4.1 g) were dissolved in xylene (50 ml), and stirred for 3 hours. When the reaction was finished, the reaction solution was cooled to room temperature, then transferred to a separatory funnel, and extracted with water and toluene. The extract was dried with MgSO$_4$, then filtered and concentrated, and purified by recrystallization (ethyl acetate/hexane) to obtain Compound BD-A-2 (7.2 g). (Yield 67%, MS[M+H]$^+$=751)

7-2) Preparation of Compound BD-A-1

To a flask holding Compound BD-A-2 (7.2 g) and xylene (100 ml), an n-butyllithium pentane solution (8 ml, 2.5 M in hexane) was added dropwise at 0° C. under the argon atmosphere. After the dropwise addition was finished, the result was stirred for 2 hours after raising the temperature to 50° C. The result was cooled to −40° C., boron tribromide (2.80 ml) was added thereto, and the result was stirred for 4 hours after raising the temperature to room temperature. After that, the result was cooled again to 0° C., N,N-diisopropylethylamine (8 ml) was added thereto, and the reaction solution was further stirred for 30 minutes at room temperature. The solution was separated by adding a saturated NaCl solution and ethyl acetate thereto, and the solvent was removed by vacuum distillation. The result was purified using silica gel column chromatography to obtain Compound BD-A-1 (1.5 g). (Yield 23%, MS[M+H]$^+$=680)

7-3) Preparation of Compound BD-A

Compound BD-A-1 (1.5 g), diphenylamine (0.42 g), Pd(P-tBu$_3$)$_2$ (25 mg) and NaOtBu (2.2 g) were dissolved in xylene (20 ml) and stirred for 2 hours at 130° C. The reaction solution was cooled to room temperature, and the solution was separated by adding a saturated NH$_4$Cl solution and toluene thereto, and the solvent was removed by vacuum distillation. The result was purified using silica gel column chromatography to obtain Compound BD-A (1.2 g). (Yield 67%, MS[M+H]$^+$=812)

EXAMPLE

Examples 1 to 6 and Comparative Examples 1 to 5

A glass substrate on which indium tin oxide (ITO) was coated as a thin film to a thickness of 150 nm was placed in detergent-dissolved distilled water and ultrasonic cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of isopropyl alcohol, acetone and methanol, then dried, and then transferred to a plasma cleaner. In addition, the substrate was cleaned for 5 minutes using nitrogen plasma, and then transferred to a vacuum depositor. On the transparent ITO electrode prepared as above, a hole injection layer was formed by thermal vacuum depositing the following HAT-CN compound to a thickness of 5 nm. Subsequently, the following HTL1 was thermal vacuum deposited to a thickness of 100 nm and then the following HTL2 was thermal vacuum deposited to a thickness of 10 nm to form a hole transfer layer. Then, a light emitting layer having a thickness of 20 nm was formed by simultaneously vacuum depositing the following BD-A compound as a dopant and a compound described in the following Table 1 as a host in a weight ratio of 5:95. Then, the following ETL was vacuum deposited to a thickness of 20 nm to form an electron transfer layer. Then, LiF was vacuum deposited to a thickness of 0.5 nm to form an electron injection layer. Then, aluminum was deposited to a thickness of 100 nm to form a cathode, and as a result, an organic light emitting device was manufactured.

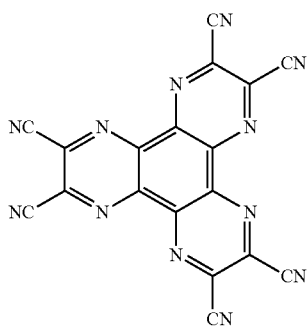

[HAT-CN]

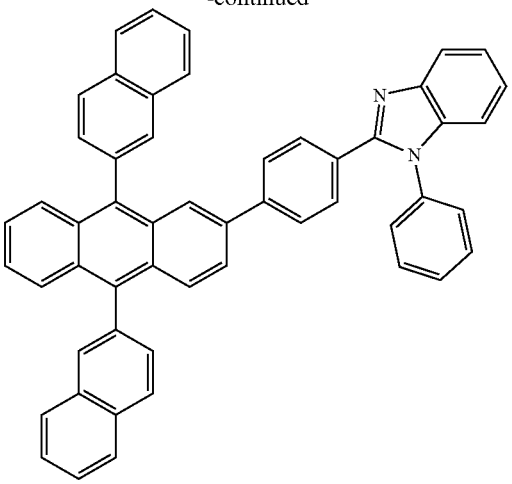

ETL

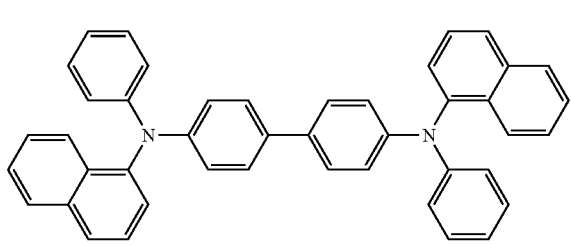

HTL1

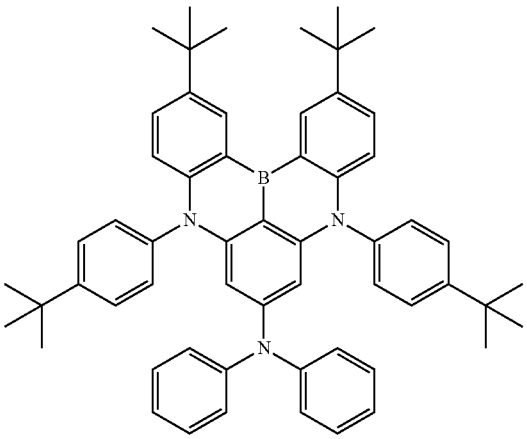

BD-A

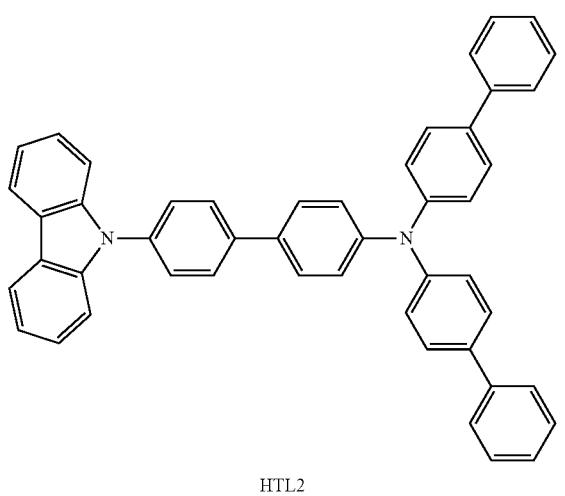

HTL2

For each of the organic light emitting devices manufactured in Examples 1 to 6 and Comparative Examples 1 to 5, driving voltage, light emission efficiency, color coordinate and lifetime were measured at current density of 10 mA/cm$^2$, and the results are shown in the following Table 1.

BH-A
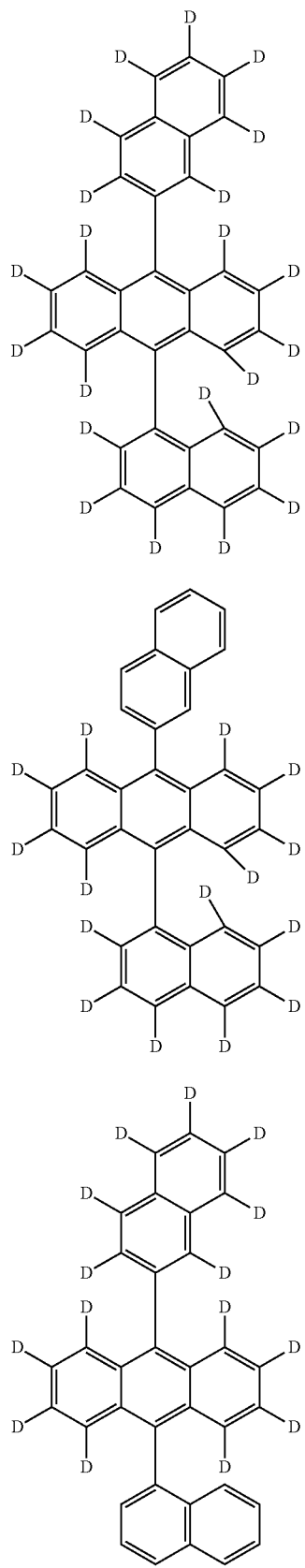
BH-B
BH-C
BH-D
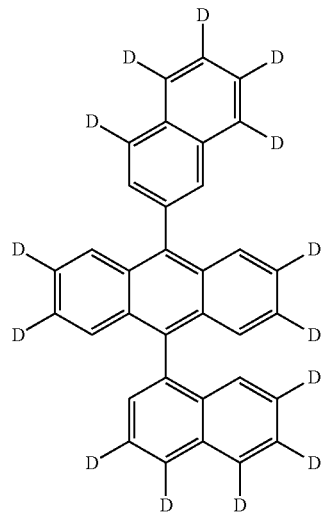
BH-E
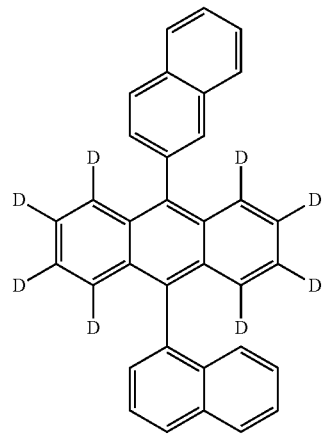
BH-F
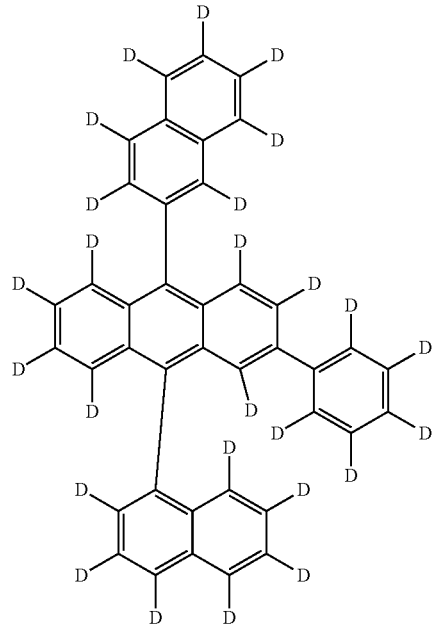

BH-1
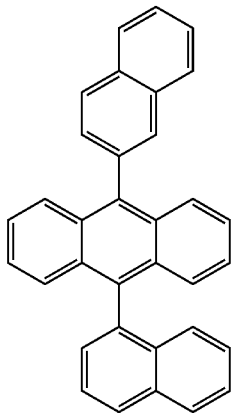
BH-2
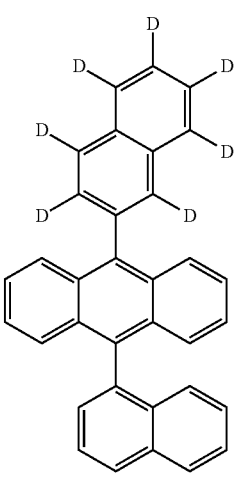
BH-3
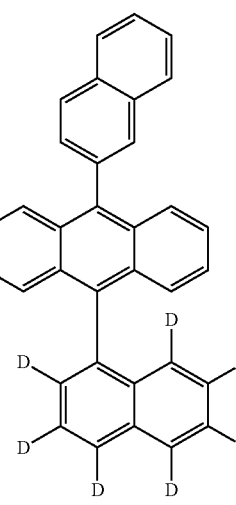
BH-4
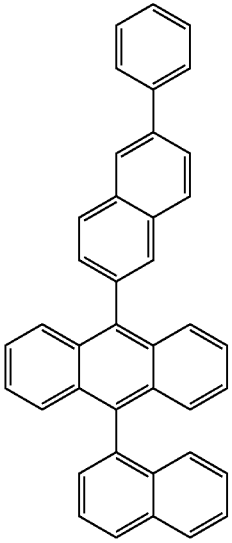
BH-5
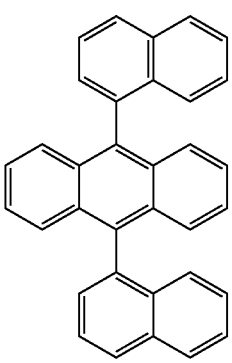
TABLE 1
| | | | Measured Value at 10 mA/cm² | | | | |
| | | | Driving Voltage | Light Emission Efficiency | Color Coordinate | | Lifetime |
| | Host | Dopant | ($V_{OP}$) | (Cd/A) | CIE_x | CIE_y | ($T_{97}$) |
|---|---|---|---|---|---|---|---|
| Example 1 | BH-A | BD-A | 4.63 | 6.84 | 0.134 | 0.127 | 215 |
| Example 2 | BH-B | BD-A | 4.63 | 6.86 | 0.134 | 0.127 | 207 |

TABLE 1-continued

| | Host | Dopant | Driving Voltage ($V_{OP}$) | Light Emission Efficiency (Cd/A) | Color Coordinate CIE_x | Color Coordinate CIE_y | Lifetime ($T_{97}$) |
|---|---|---|---|---|---|---|---|
| Example 3 | BH-C | BD-A | 4.62 | 6.85 | 0.134 | 0.127 | 205 |
| Example 4 | BH-D | BD-A | 4.62 | 6.87 | 0.134 | 0.127 | 193 |
| Example 5 | BH-E | BD-A | 4.64 | 6.86 | 0.134 | 0.127 | 187 |
| Example 6 | BH-F | BD-A | 4.50 | 6.88 | 0.135 | 0.131 | 224 |
| Comparative Example 1 | BH-1 | BD-A | 4.62 | 6.85 | 0.134 | 0.127 | 152 |
| Comparative Example 2 | BH-2 | BD-A | 4.60 | 6.88 | 0.134 | 0.127 | 164 |
| Comparative Example 3 | BH-3 | BD-A | 4.59 | 6.86 | 0.134 | 0.127 | 166 |
| Comparative Example 4 | BH-4 | BD-A | 4.74 | 6.84 | 0.135 | 0.129 | 131 |
| Comparative Example 5 | BH-5 | BD-A | 4.80 | 6.85 | 0.134 | 0.125 | 98 |

As shown in Table 1, it was seen that the organic light emitting devices of Examples 1 to 6 including the compound of Chemical Formula 1 and the compound of Chemical Formula 2 respectively as a dopant and a host of a light emitting layer had excellent driving voltage, light emission efficiency and/or lifetime compared to the organic light emitting device of Comparative Example 1 including the compound of Chemical Formula 1 as a dopant but including an existing anthracene derivative compound as a host.

Hereinbefore, preferred experimental examples of the present disclosure have been described, however, the present disclosure is not limited thereto, and various modifications may be made within the scope of the claims and the detailed descriptions of the disclosure, and these also fall within the category of the disclosure.

The invention claimed is:

1. An organic light emitting device comprising:
an anode;
a cathode; and
one or more organic material layers provided between the anode and the cathode,
wherein the one or more organic material layers include a light emitting layer, and the light emitting layer includes a compound of Chemical Formula 1 and a compound of Chemical Formula 2, and
the one or more material layers include a hole injection layer between the anode and the light emitting layer, and the hole injection layer comprises HAT-CN, and
wherein a weight ratio of the compound of Chemical Formula 1 and the compound of Chemical Formula 2 is 3:97 to 7:93:

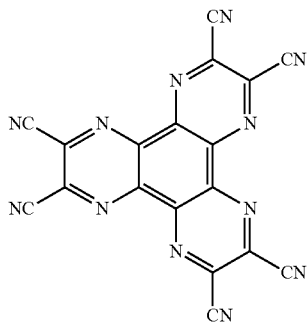

[HAT-CN]

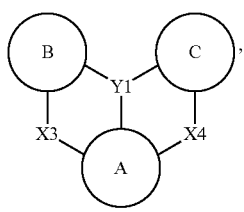

[Chemical Formula 1]

wherein in Chemical Formula 1,

A, B and C are each independently a substituted or unsubstituted aromatic hydrocarbon ring; or a substituted or unsubstituted heteroring, X3 and X4 are each independently O; S; or NR, Y1 is boron or phosphine oxide, R is hydrogen; deuterium; a halogen group; a cyano group; a substituted or unsubstituted alkyl group; a substituted or unsubstituted silyl group; a substituted or unsubstituted alkoxy group; a substituted or unsubstituted aryl group; or a substituted or unsubstituted heterocyclic group, and two or more adjacent R, A, B and C groups bond to each other to form a ring, wherein the compound of Chemical Formula 2 is selected from among;
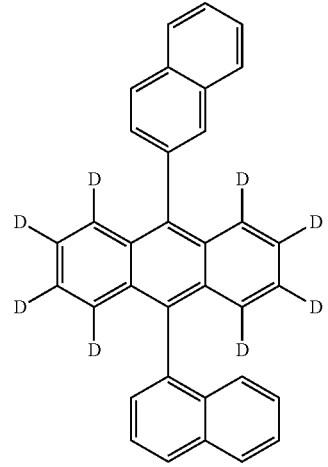
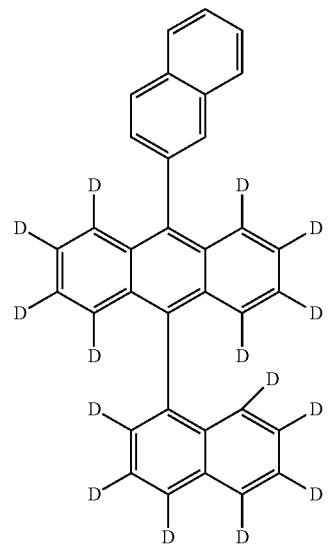
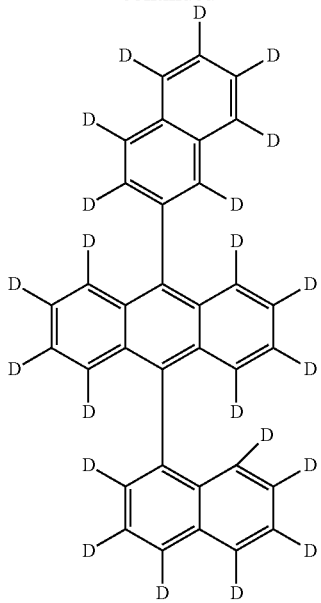
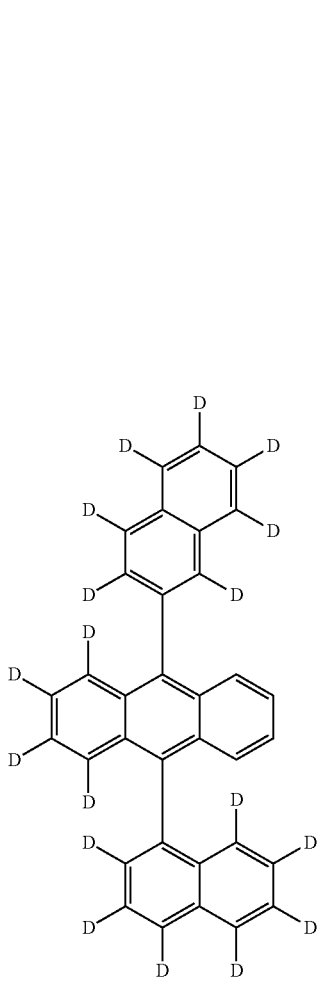

-continued
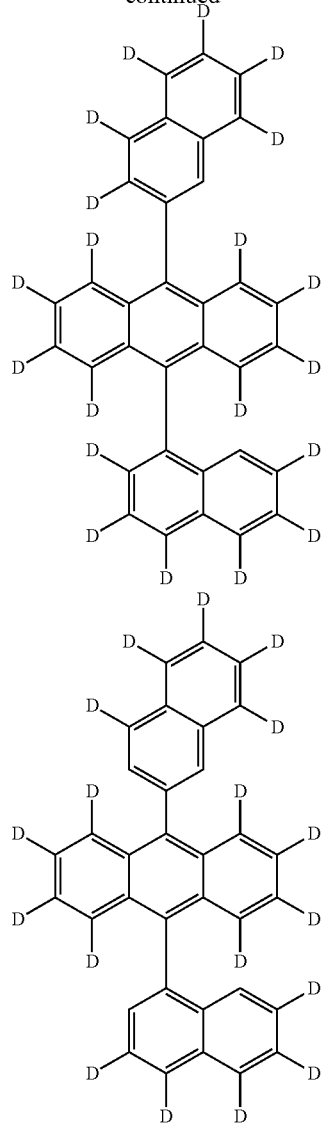
-continued
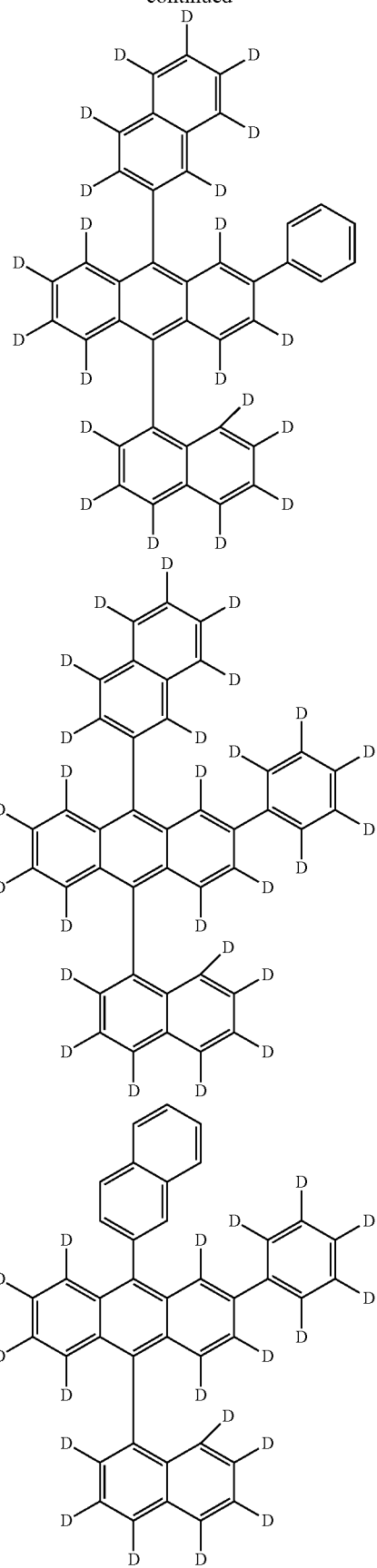

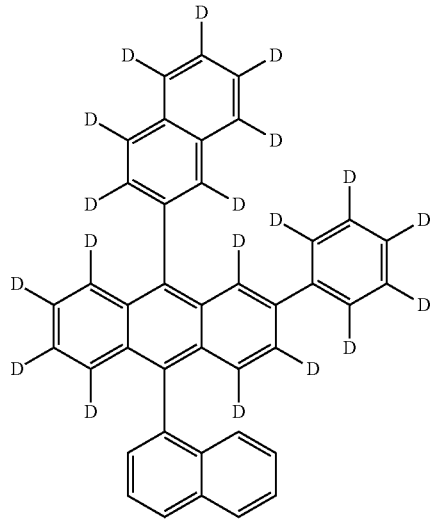
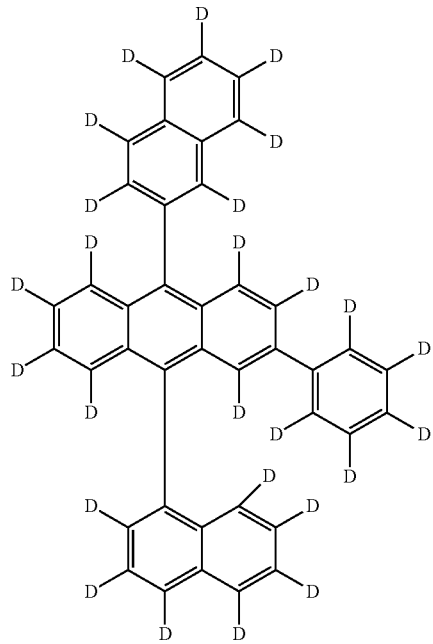
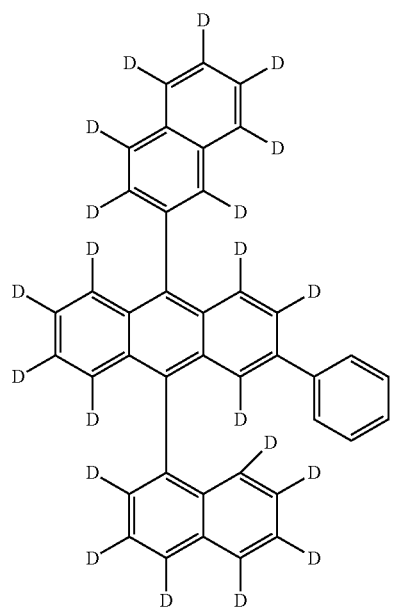
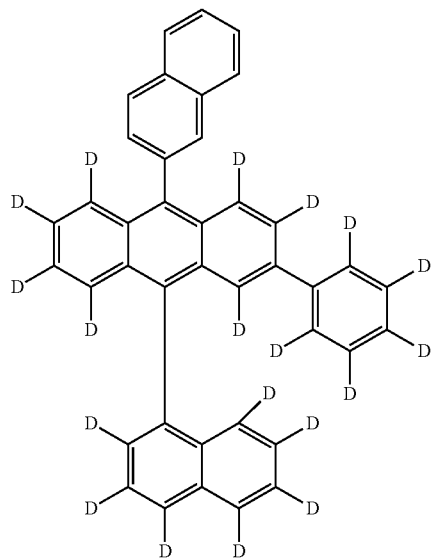

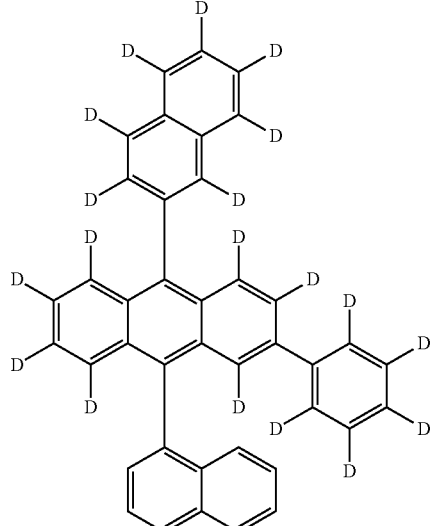
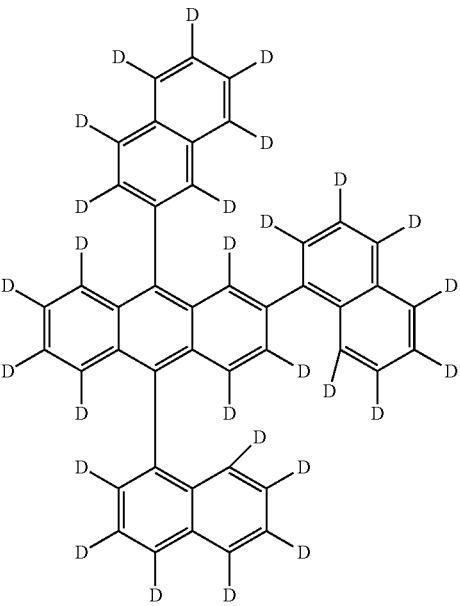
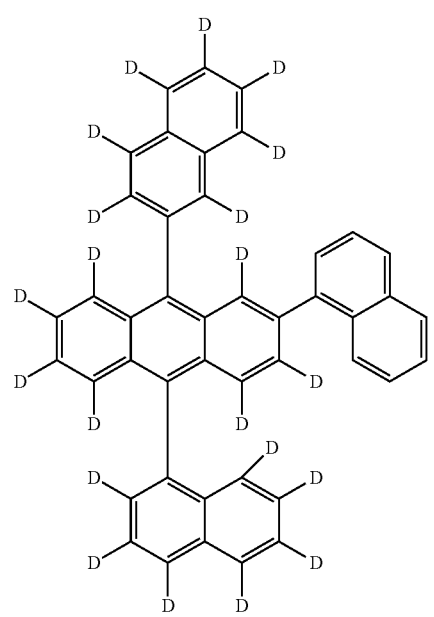
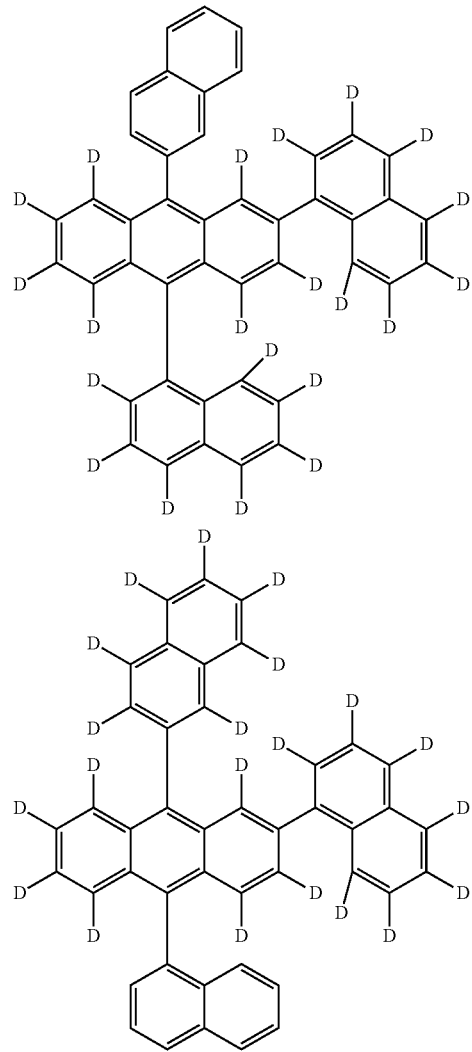

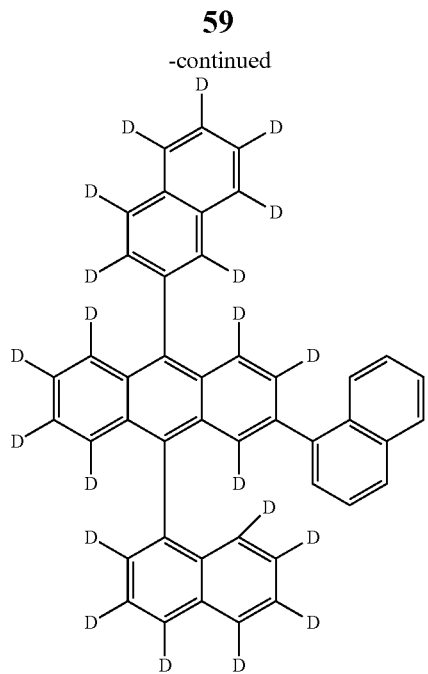

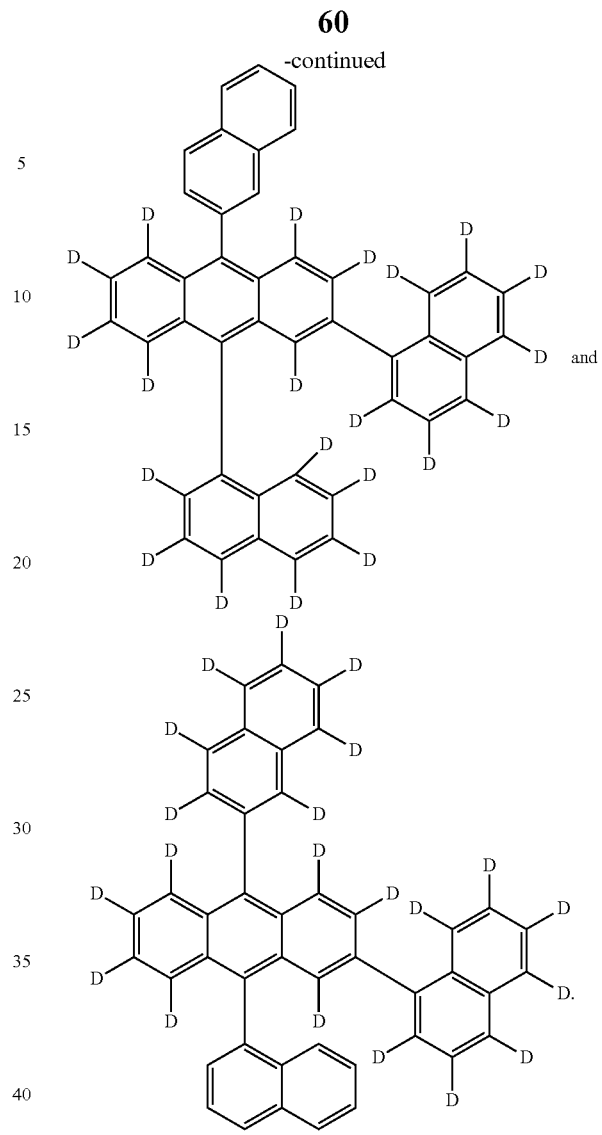

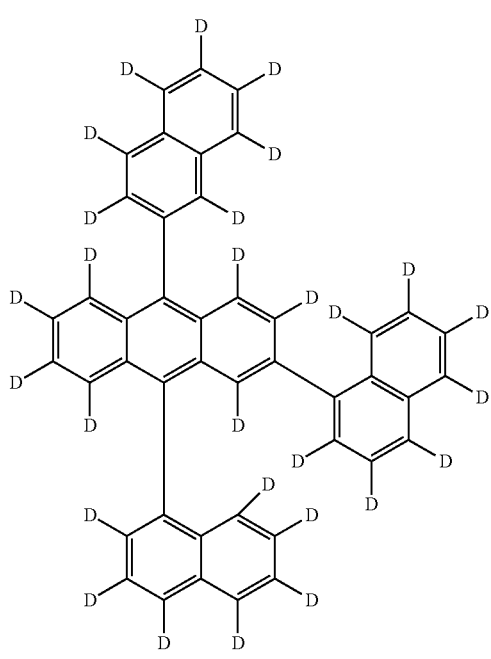

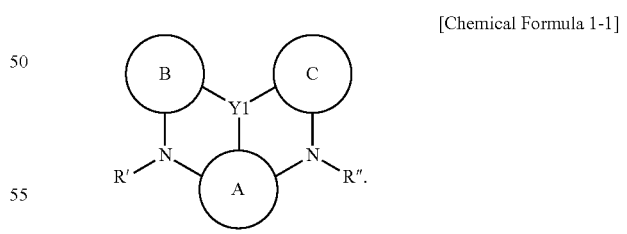

2. The organic light emitting device of claim 1, wherein Chemical Formula 1 is represented by Chemical Formula 1-1:

[Chemical Formula 1-1]

wherein in Chemical Formula 1-1,
A, B, C and Y1 are the same as in Chemical Formula 1,
R' and R" are each independently hydrogen; deuterium; a halogen group; a cyano group; a substituted or unsubstituted alkyl group; a substituted or unsubstituted silyl group; a substituted or unsubstituted alkoxy group; a substituted or unsubstituted aryl group; or a substituted or unsubstituted heterocyclic group, and
adjacent R', R", A, B and C groups bond to each other to form a ring.

3. The organic light emitting device of claim 1, wherein Chemical Formula 1 is represented by Chemical Formula 1-2:

[Chemical Formula 1-2]

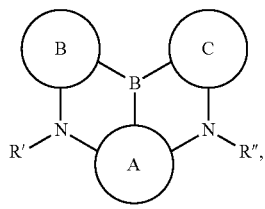

wherein in Chemical Formula 1-2,

A, B and C are the same as in Chemical Formula 1,

R' and R" are each independently a substituted or unsubstituted aryl group; or a substituted or unsubstituted heterocyclic group, and adjacent R', R", B and C groups bond to each other to form a substituted or unsubstituted hydrocarbon ring or a substituted or unsubstituted hetero ring.

4. The organic light emitting device of claim 1, wherein A, B and C are each independently a substituted or unsubstituted benzene; a substituted or unsubstituted naphthalene; or a dibenzofuran.

5. The organic light emitting device of claim 1, wherein R is a substituted or unsubstituted phenyl group; or a substituted or unsubstituted naphthyl group.

6. The organic light emitting device of claim 1, wherein the compound of Chemical Formula 1 is selected from among:

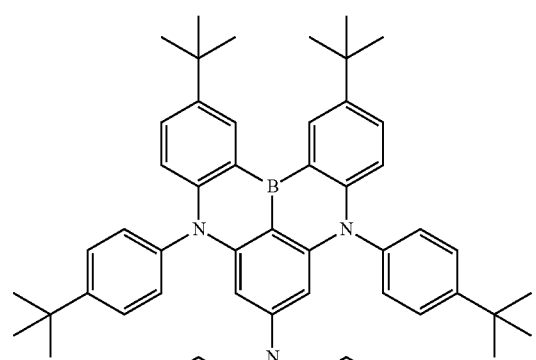

-continued

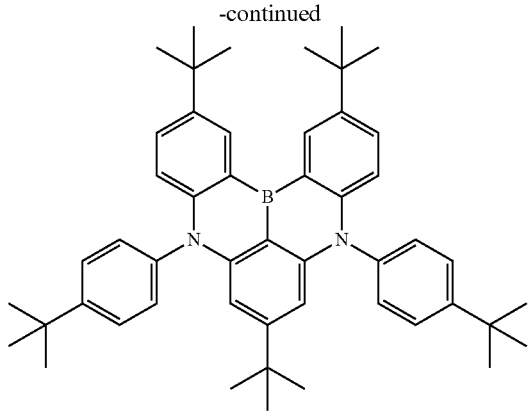

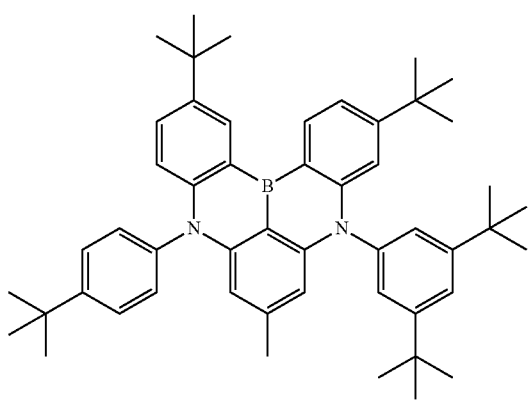

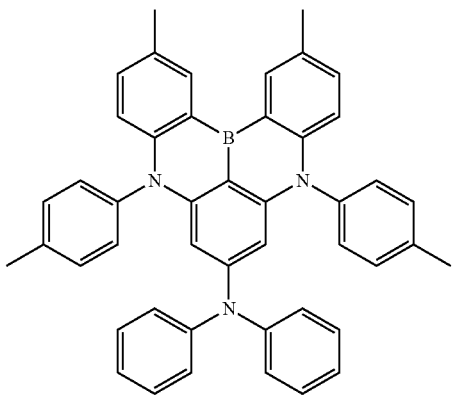

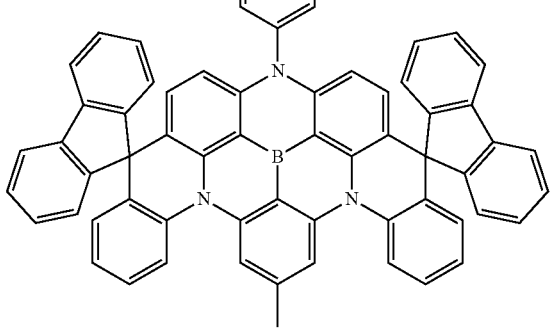

63
-continued
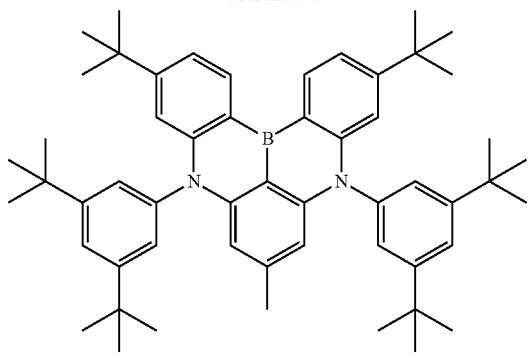
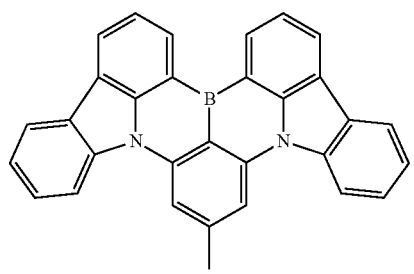
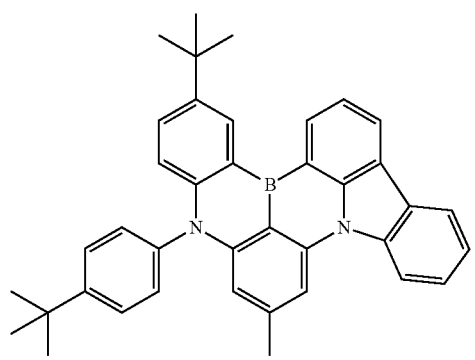
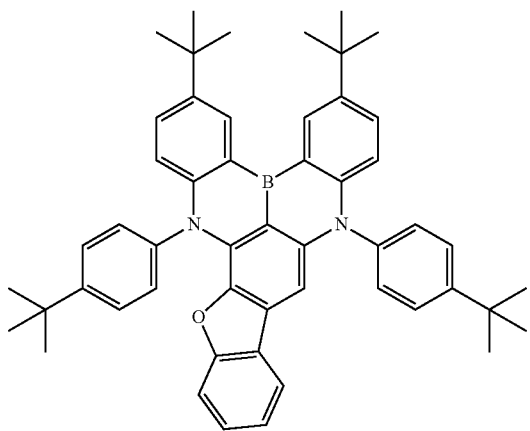
64
-continued
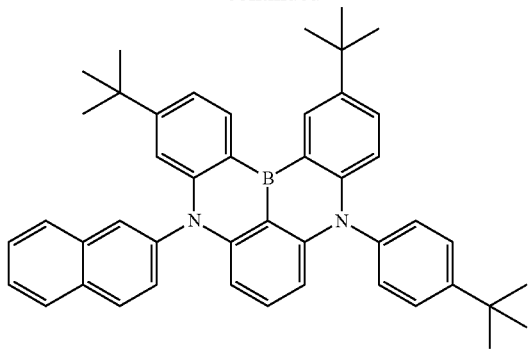
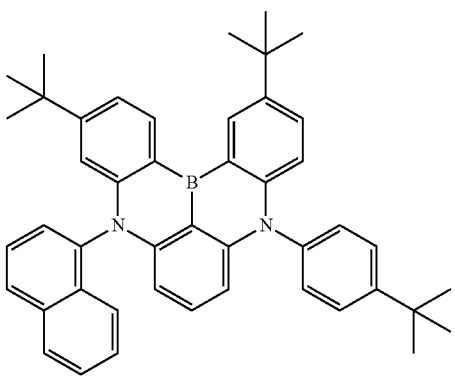
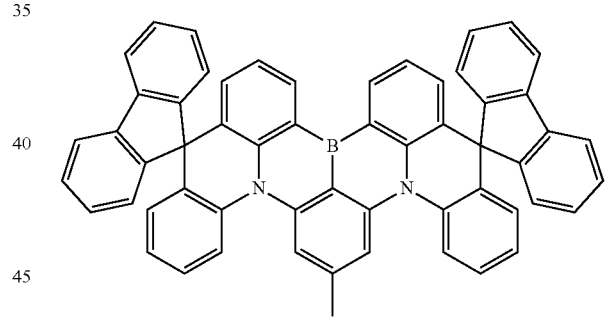
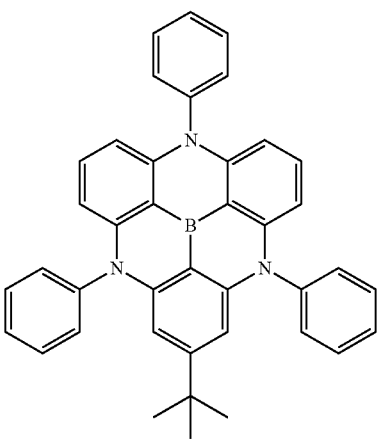

65
-continued
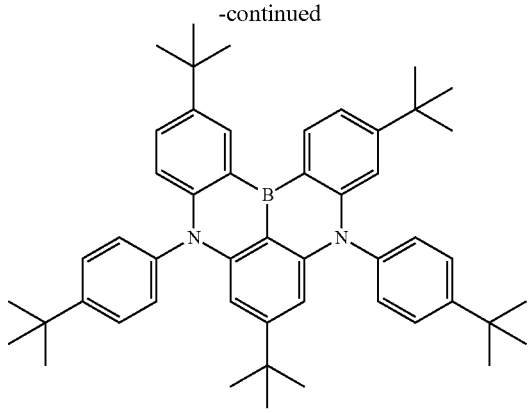
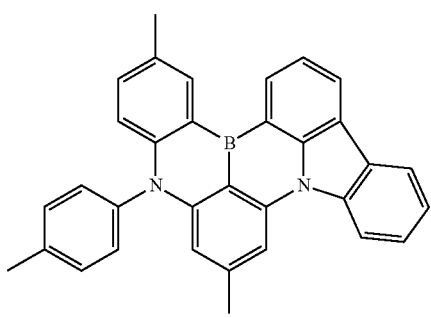
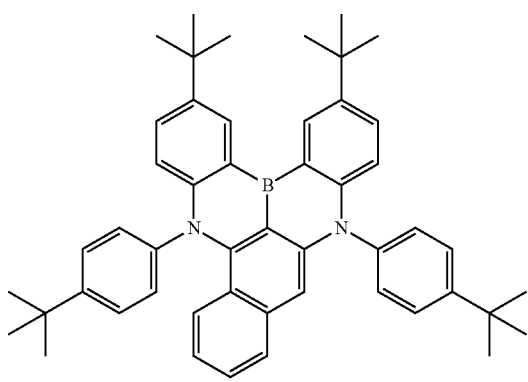
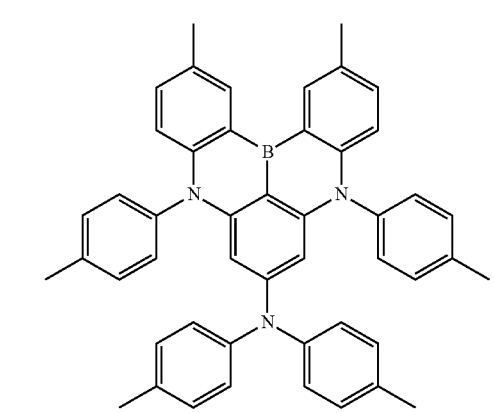
66
-continued
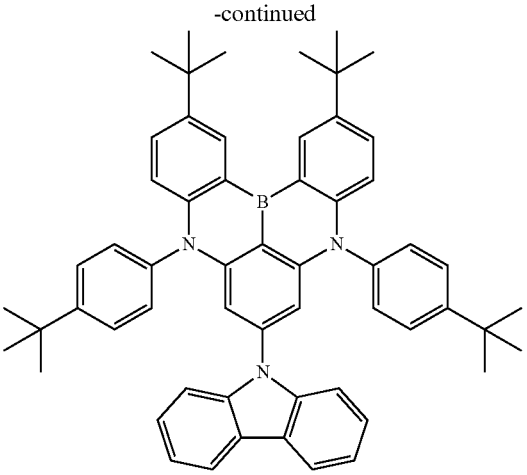
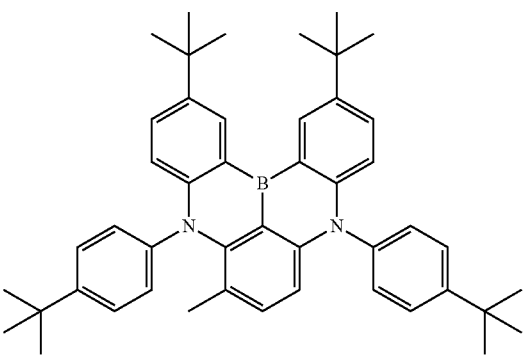
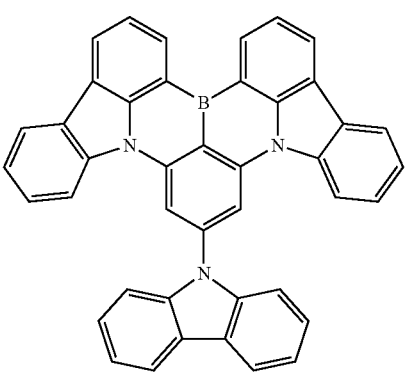

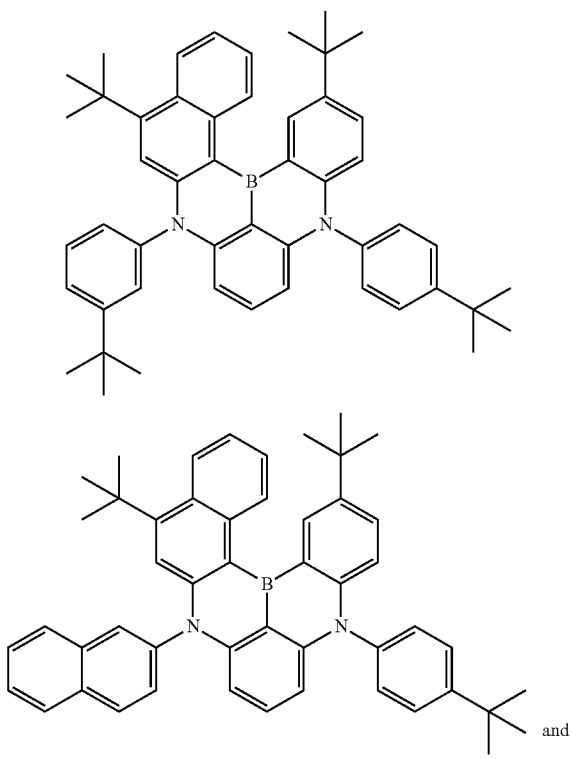
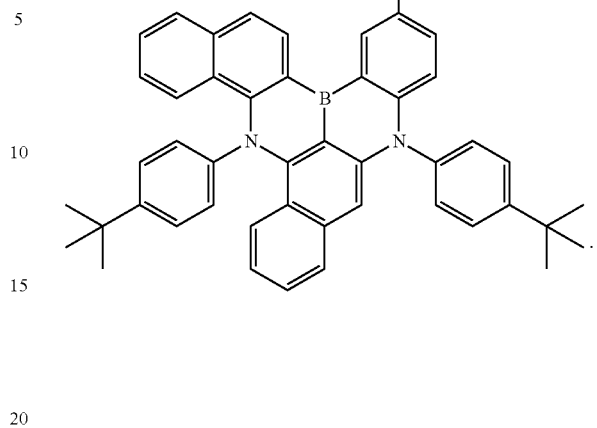
7. The organic light emitting device of claim 1, wherein the light emitting layer includes a dopant material and a host material, and wherein the dopant material is the compound of Chemical Formula 1 and the host material is the compound of Chemical Formula 2.
* * * * *